United States Patent [19]

Stenerson

[11] Patent Number: 4,597,083
[45] Date of Patent: Jun. 24, 1986

[54] ERROR DETECTION AND CORRECTION IN DIGITAL COMMUNICATION SYSTEMS

[75] Inventor: Roger M. Stenerson, Corvallis, Oreg.

[73] Assignee: Ampex Corporation, Redwood City, Calif.

[21] Appl. No.: 597,538

[22] Filed: Apr. 6, 1984

[51] Int. Cl.[4] ............................................. G06F 11/12
[52] U.S. Cl. ........................................ 371/37; 371/38
[58] Field of Search ............................ 371/37, 38, 39

[56] References Cited

U.S. PATENT DOCUMENTS

| | | | |
|---|---|---|---|
| 3,137,788 | 6/1964 | Froggatt | 371/54 |
| 3,227,865 | 1/1966 | Hoernes | 371/54 |
| 3,349,370 | 10/1967 | Garrett | 371/55 |
| 3,495,215 | 2/1970 | McManus et al. | 371/26 |
| 3,781,829 | 12/1973 | Singh | 371/27 |
| 4,117,458 | 9/1978 | Burghard | 371/37 |
| 4,142,174 | 2/1979 | Chen | 371/37 |
| 4,162,480 | 7/1979 | Berlekamp | 340/146.1 AL |
| 4,410,989 | 10/1983 | Berlekamp | 371/37 |
| 4,413,339 | 11/1983 | Riggle et al. | 371/38 |
| 4,413,340 | 11/1983 | Odaka | 371/38 |

FOREIGN PATENT DOCUMENTS

| | | | |
|---|---|---|---|
| 1184498 | 3/1970 | United Kingdom | 371/54 |
| 2038145 | 7/1980 | United Kingdom | 371/54 |

OTHER PUBLICATIONS

Berlekamp, Elwyn R., Algebraic Coding Theory, Mc-Graw Hill Book Company, New York, 1968, pp. 44-47.
Sugiyama, Y., et al., "A Method for Solving Key Equation for Decoding Goppa Codes," Information and Control, vol. 27, No. 1, Jan. 1975, pp. 87-99.
Berlekamp, Elwyn R., "Bit-Serial Reed-Solomon Encoders," IEEE Transactions on Information Theory, vol. IT-28, No. 6, Nov. 1982, pp. 869-874.

*Primary Examiner*—Michael R. Fleming
*Attorney, Agent, or Firm*—Bob Schumacher; Joel D. Talcott

[57] ABSTRACT

An error detection and correction system locates and corrects double errors in a received data block word digitally encoded in a Reed-Solomon code (n,K) as coefficient terms of an n-order codeword polynomial in the form $$C(x) = \sum_{i=0}^{n-1} c_i x_i$$

where the coefficients are powers of the primitive â of a Galois field, which codeword is divisible by a code generator polynomial in the form of a product of a plurality of different factors in the form $(x + â^i)$. Four syndrome signals are derived, each corresponding to a respective first order syndrome equal to the remainder upon dividing a received data block word by a respective factor. An error locator responsive to the four syndrome signals derives a reference signal corresponding to the position h of a reference term in the received data block word equally spaced relative to the two terms containing errors, and a relative position signal k corresponding to the number of terms by which the terms containing the errors are spaced from the reference term. An error solution circuit responsive to the four syndrome signals produces first and second error solution signals corresponding to the differences between the respective received terms containing the errors and the corresponding terms as encoded. An error correction circuit adds the error solution signals to the received data block at the proper places to reproduce the encoded codeword. A fifth syndrome signal may be used to determine if there are more than two errors. Two syndromes may be used to correct single errors.

20 Claims, 39 Drawing Figures

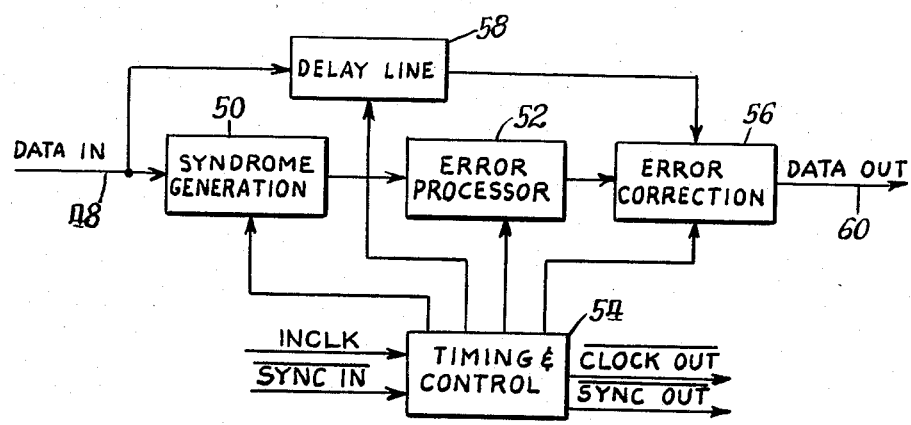
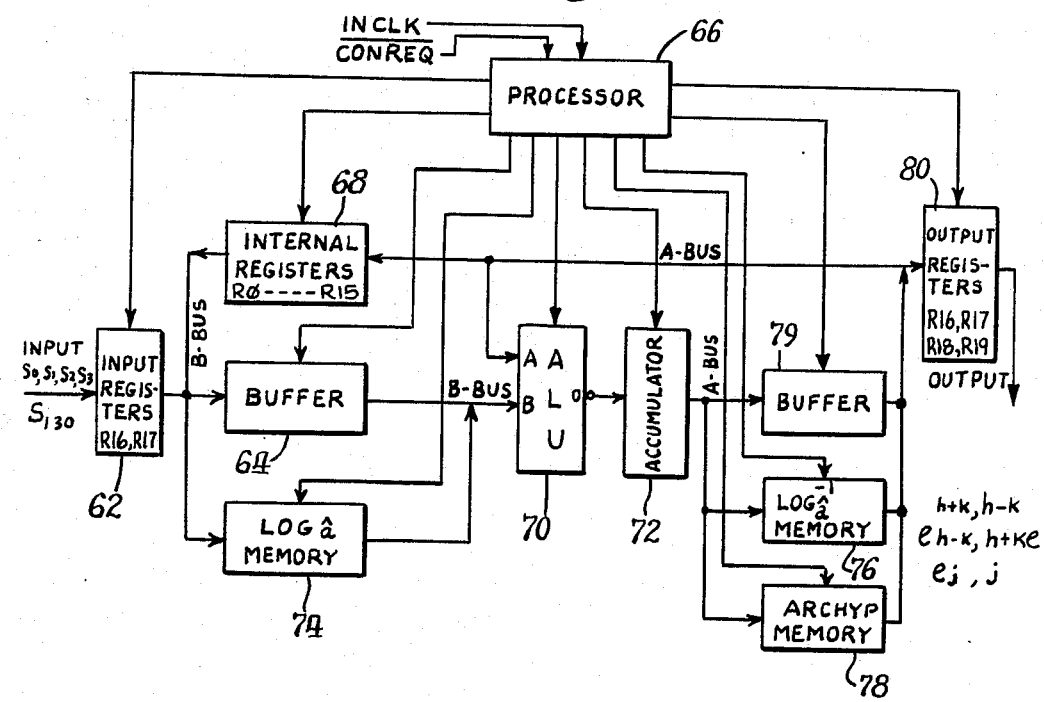

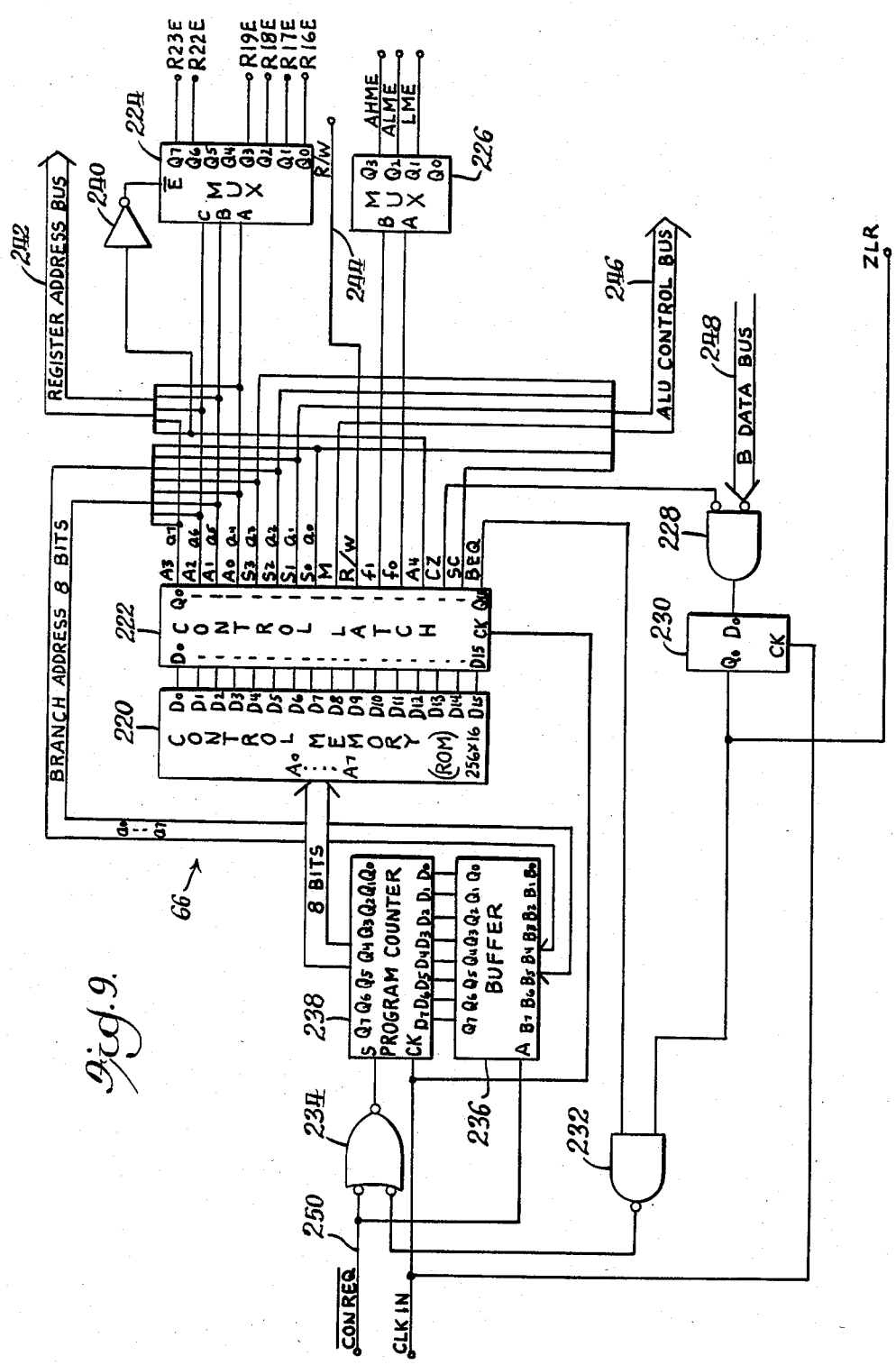

| Bit Number | ALU operation | Branch Operation | Comments |
|---|---|---|---|
| 15 | $A_3$ | $a_7$ | $A_4$ through $A_0$ are the register number |
| 14 | $A_2$ | $a_6$ | $a_7$ through $a_0$ are the branch address |
| 13 | $A_1$ | $a_5$ | |
| 12 | $A_0$ | $a_4$ | |
| 11 | $S_3$ | $a_3$ | $S_3$ through $S_0$ and M define the ALU operation |
| 10 | $S_2$ | $a_2$ | |
| 9 | $S_1$ | $a_1$ | |
| 8 | $S_0$ | $a_0$ | |
| 7 | M | | |
| 6 | R/W | | 0 = write |
| 5 | $f_1$ | | $f_1$ and $f_0$ define function: $\log_y$, $\log_y^{-1}$, and archyp |
| 4 | $f_0$ | | |
| 3 | $A_4$ | | |
| 2 | ckzero | | if ckzero = 0 then test B input for zero |
| 1 | setcarry | | 1 = set |
| 0 | | BEQ | 1 = enable, branch if previous ckzero was true |

Fig. 10

| $f_1$ | $f_0$ | Function |
|---|---|---|
| 0 | 0 | no function is done |
| 0 | 1 | $\log_y$ |
| 1 | 0 | $\log_y^{-1}$ |
| 1 | 1 | archyp |

Fig. 11

| $S_3$ | $S_2$ | $S_1$ | $S_0$ | M | Function |
|---|---|---|---|---|---|
| 0 | 0 | 0 | 0 | 0 | acc = acc + 1 (must setcarry) |
| 0 | 0 | 1 | 1 | 0 | acc = (2 • acc) mod 255 |
| 0 | 1 | 1 | 0 | 0 | acc = (acc + b) mod 255 |
| 0 | 0 | 0 | 0 | 1 | acc = 255 - acc |
| 0 | 0 | 1 | 1 | 1 | acc = 255 |
| 0 | 1 | 0 | 1 | 1 | acc = 255 - b |
| 1 | 0 | 0 | 1 | 1 | acc = acc XOR b |
| 1 | 0 | 1 | 0 | 1 | acc = b |
| 1 | 0 | 1 | 1 | 1 | acc = acc OR b |
| 1 | 1 | 0 | 0 | 1 | acc = 0 |
| 1 | 1 | 1 | 1 | 1 | acc = a |

Fig. 12

| register number | during conversion | during solution |
|---|---|---|
| 0 | $S_{126}$ | |
| 1 | $S_{127}$ | |
| 2 | $S_{128}$ | |
| 3 | $S_{129}$ | |
| 4 | $s_3$ | 0 |
| 5 | $s_2$ | used |
| 6 | $s_1$ | $h+k$ |
| 7 | $s_0$ | $h-k$ |
| 8 | | $P_1$ |
| 9 | | $P_2$ |
| 10 | | $P_3$ |
| 11 | | $h$ |
| 12 | 126 | $k$ |
| 13 | 127 | $e_{h+k}$ |
| 14 | 128 | $e_{h-k}$ |
| 15 | 129 | used |

| register number | input usage | output usage |
|---|---|---|
| 16 | $S_{130}$ | $h+k$ |
| 17 | $s_0,s_1,s_2,s_3$ | $h-k$ |
| 18 | not used | $e_{h+k}$ |
| 19 | not used | $e_{h-k}$ |

RS(255,243)

PROCESSOR PROGRAM

| Labels | Instruction | Comments |
|---|---|---|
| start | acc = r17 | read $s_3$ |
| | r4 = acc, acc = 0 | |
| | acc = acc + 1 | convert the fourth-order |
| | acc = acc + acc | syndrome into 4 first- |
| | r12 = acc, acc = acc + acc | order syndromes |
| | acc = acc + 1 | |
| | acc = acc + r12 | |
| | acc = acc + acc | |
| | r12 = acc, acc = acc + acc | |
| | acc = acc + acc | |
| | acc = acc + acc | |
| | acc = acc + r12 | |
| | r12 = acc | |
| | acc = r17 | read $s_2$ |
| | r5 = acc | |
| | acc = r12 | |
| | acc = acc + 1 | |
| | r13 = acc, acc = acc | |
| | acc = acc + 1 | |
| | r14 = acc, acc = acc | |
| | acc = acc + 1 | |
| | r15 = acc | |
| | acc = r12 | |
| | acc = acc + log(r4) tst | |
| | acc = alog(acc) ^ r5 | |
| | r0 = acc | |
| | acc = r17 | read $s_1$ |
| | r6 = acc | |
| | acc = r12 | |
| | acc = acc + log(r0) tst | |
| | acc = alog(acc) ^ r6 | |
| | r0 = acc | |
| | acc = r13 | |
| | acc = acc + log(r4) tst | |
| | acc = alog(acc) ^ r5 | |
| | r1 = acc | |
| | acc = r13 | |
| | acc = acc + log(r1) tst | |
| | acc = alog(acc) ^ r6 | |
| | r1 = acc | |
| | acc = r14 | |
| | acc = acc + log(r4) tst | |
| | acc = alog(acc) ^ r5 | |
| | r2 = acc | |
| | acc = r17 | read $s_0$ |
| | r7 = acc | |
| | acc = r14 | |
| | acc = acc + log(r2) tst | |
| | acc = alog(acc) ^ r6 | |
| | r2 = acc | |
| | acc = r14 | |
| | acc = acc + log(r2) tst | |
| | acc = alog(acc) ^ r7 | |
| | r2 = acc | |
| | acc = r12 | |
| | acc = acc + log(r0) tst | |
| | acc = alog(acc) ^ r7 | |
| | r0 = acc | |
| | acc = r13 | |
| | acc = acc + log(r1) tst | |
| | acc = alog(acc) ^ r7 | |
| | r1 = acc | |
| | acc = r15 | |
| | acc = acc + log(r4) tst | |
| | acc = alog(acc) ^ r5 | |
| | r3 = acc | |
| | acc = r15 | |
| | acc = acc + log(r3) tst | |
| | acc = alog(acc) ^ r6 | |

| Labels | Instruction | Comments |
|---|---|---|
| | r3 = acc, acc = 0 | |
| | r18 = acc, acc = acc | |
| | r19 = acc, acc = acc | |
| | r10 = acc, acc = acc | |
| | r4 = acc | |
| | acc = r15 | |
| | acc = acc + log(r3) tst | |
| | acc = alog(acc) ^ r7 | |
| | r3 = acc, acc = acc | |
| | acc = acc \| r1 | |
| | acc = acc \| r2 | |
| | r5 = acc | |
| | acc = r5 tst | |
| | BEQ end | if there are no errors, |
| $P_1$ | acc = log(r1) | branch solve for $P_1$ |
| | acc = acc + log(r1) tst | |
| | r8 = alog(acc) | |
| | acc = r0 tst | |
| | BEQ P2 | |
| | acc = log(r0) | |
| | acc = acc + log(r2) tst | |
| | acc = alog(acc) ^ r8 | |
| | r8 = acc | |
| $P_2$ | acc = log(r2) | solve for $P_2$ |
| | acc = acc + log(r2) tst | |
| | r9 = alog(acc) | |
| | acc = r1 tst | |
| | BEQ P3 | |
| | acc = log(r1) | |
| | acc = acc + log(r3) tst | |
| | acc = alog(acc) ^ r9 | |
| | r9 = acc | |
| $P_3$ | acc = r0 tst | solve for $P_3$ |
| | BEQ #1 | |
| | acc = log(r0) | |
| | acc = acc + log(r3) tst | |
| | r10 = alog(acc) | |
| #1 | acc = r1 tst | |
| | BEQ #2 | |
| | acc = log(r1) | |
| | acc = acc + log(r2) tst | |
| | acc = alog(acc) ^ r10 | |
| | r10 = acc | |
| #2 | acc = r10 | determine if only one |
| | acc = acc \| r8 | error exists |
| | acc = acc \| r9 | |
| | r5 = acc | |
| | acc = r5 tst | |
| | BEQ 1err | if there is only one |
| h | acc = 255 - log(r8) | error, branch |
| | acc = acc + log(r9) | solve for h |
| | acc = acc + acc | |
| | acc = acc + acc | |
| | acc = acc + acc | |
| | acc = acc + acc | |
| | acc = acc + acc | |
| | acc = acc + acc | |
| | r11 = acc | |
| k | acc = log(r8) | solve for k |
| | acc = acc + log(r9) | |
| | acc = 255 - acc | |
| | acc = acc + acc | |
| | acc = acc + acc | |
| | acc = acc + acc | |
| | acc = acc + acc | |
| | acc = acc + acc | |
| | acc = acc + acc | |
| | acc = acc + acc | |
| | acc = acc + log(r10) | |
| | acc = alog(acc) | |

Fig. 17A

| Labels | Instruction | Comments | Labels | Instruction | Comments |
|---|---|---|---|---|---|
| | r12 = acc = archyp(acc) | | | acc = r5 tst | |
| $e_{h+k}$ | r15 = alog(acc) | determine if $k$ | | BEQ 2err | if the solution is valid, branch |
| | acc = r12 tst | has a valid solution | bb | acc = r4 | dummy instruction |
| | BEQ bb | if there is no valid | | acc = r23 | increment bad block counter |
| | acc = 255 - r12 | solution, branch | | acc = r4 tst | |
| | acc = alog(acc) ^ r15 | solve for $e_{h+k}$ | | BEQ end | branch to the end |
| | r15 = acc | | 2err | acc = r13 | store the errors and locations in |
| | acc = 255 - r12 | | | r18 = acc | the output registers |
| | acc = acc + r11 | | | acc = r14 | |
| | r7 = acc, acc = acc | | | r19 = acc | |
| | acc = acc + log(r1) | | | acc = r6 | |
| | acc = acc + log(r1) tst | | | r6 = alog(acc) | alog taken to check for ff |
| | r13 = alog(acc) | | | acc = r22 | increment correction counter |
| | acc = 255 - r7 | | | acc = r7 | |
| | acc = acc + log(r2) | | | r7 = alog(acc) | alog taken to check for ff |
| | acc = acc + log(r2) tst | | | acc = r4 tst | |
| | acc = alog(acc) ^ r13 | | | BEQ end_16 | branch to the end |
| | r13 = acc | | 1err | acc = 255 - log(r1) | solve for the one error case |
| | acc = log(r13) | | | acc = acc + log(r2) tst | |
| | acc = acc + acc | | | r6 = alog(acc) | alog taken to check for ff |
| | acc = acc + acc | | | acc = log(r1) | |
| | acc = acc + acc | | | acc = acc + log(r2) | |
| | acc = acc + acc | | | acc = acc + acc | |
| | acc = acc + acc | | | acc = acc + acc | |
| | acc = acc + acc | | | acc = acc + acc | |
| | acc = acc + acc | | | acc = acc + acc | |
| | r13 = acc | | | acc = acc + acc | |
| | acc = 255 - log(r15) | | | acc = acc + acc | |
| | r15 = acc, acc = acc | | | r18 = alog(acc) | |
| | acc = acc + r13 | | end_16 | acc = log(r6) | |
| | r13 = alog(acc) | | | acc = acc + acc | |
| $e_{h-k}$ | acc = r11 | solve for $e_{h-k}$ | | acc = acc + acc | |
| | acc = acc + r12 | | | acc = acc + acc | |
| | r6 = acc, acc = acc | | | acc = acc + acc | |
| | acc = acc + log(r1) | | | r16 = acc | |
| | acc = acc + log(r1) tst | | | acc = r22 | increment correction counter |
| | r14 = alog(acc) | | | acc = log(r7) | |
| | acc = 255 - r6 | | | acc = acc + acc | |
| | acc = acc + log(r2) | | | acc = acc + acc | |
| | acc = acc + log(r2) tst | | | acc = acc + acc | |
| | acc = alog(acc) ^ r14 | | | acc = acc + acc | |
| | r14 = acc | | | r17 = acc | |
| | acc = log(r14) | | end | acc = r4 tst | loop until a GOTO 0 is |
| | acc = acc + acc | | | BEQ end | encountered |
| | acc = acc + acc | | | | |
| | acc = acc + acc | | | | |
| | acc = acc + acc | | | | |
| | acc = acc + acc | | | | |
| | acc = acc + acc | | | | |
| | acc = acc + acc | | | | |
| | acc = acc + r15 | | | | |
| | r14 = alog(acc) | | | | |
| | acc = r6 | determine whether | | | |
| | acc = acc + acc | or not the solution | | | |
| | acc = acc + acc | is valid by checking | | | |
| | acc = acc + r6 | $S_{130}$ | | | |
| | acc = acc + log(r13) | | | | |
| | acc = acc + log(r13) tst | | | | |
| | r15 = alog(acc) | | | | |
| | acc = r7 | | | | |
| | acc = acc + acc | | | | |
| | acc = acc + acc | | | | |
| | acc = acc + r7 | | | | |
| | acc = acc + log(r14) | | | | |
| | acc = acc + log(r14) tst | | | | |
| | acc = alog(acc) ^ r15 | | | | |
| | r15 = acc | | | | |
| | acc = log(r16) | | | | |
| | acc = acc + log(r16) tst | | | | |
| | acc = alog(acc) ^ r15 | | | | |
| | r5 = acc | | | | |

*Fig. 17B* gamma130_hi

```
09b26fd45ce73a81
b209d46fe75c813a
7ec518a32b904df6
c57ea318902bf64d
e75c813ab209d46f
5ce73a8109b26fd4
902bf64dc57ea318
2b904df67ec518a3
4df62b9018a37ec5
f64d902ba318c57e
3a815ce76fd409b2
813ae75cd46fb209
a318c57ef64d902b
18a37ec54df62b90
d46fb209813ae75c
6fd409b23a815ce7
```

*Fig. 18A* gamma130_lo

```
01326754dcefba89
ba89dcef67540132
67540132ba89dcef
dcefba8901326754
cdfeab9810237645
76451023ab98cdfe
ab98cdfe76451023
10237645cdfeab98
89baefdc54673201
32015467efdc89ba
efdc89ba32015467
5467320189baefdc
4576231098abfecd
fecd98ab23104576
23104576fecd98ab
98abfecd45762310
```

```
06bd60dbbd06db60
71ca17acca71ac17
f9429f2442f9249f
8e35e853358e53e8
e8538e3553e8358e
9f24f942249f42f9
17ac71caac17ca71
60db06bddb60bd06
bd06db6006bd60db
ca71ac1771ca17ac
42f9249ff9429f24
358e53e88e35e853
53e8358ee8538e35
249f42f99f24f942
ac17ca7117ac71ca
db60bd0660db06bd
```

*Fig. 18F* control.0

```
c 4 6 4 4 6 4 4 4 4 4 4 4 c 4 4
6 4 6 4 6 4 4 0 4 4 c 4 4 0 4 4
4 0 4 4 4 0 4 4 4 0 4 4 c 4 4 0
4 4 4 0 4 4 4 0 4 4 4 0 4 4 4 0
4 4 4 0 4 4 4 0 4 4 c c 4 4 4 4
4 c 4 0 5 4 4 4 4 4 4 4 4 4 4 4
4 4 4 4 4 4 4 4 4 4 4 4 4 0 5 4
4 4 4 4 4 4 4 4 4 4 4 4 4 4 4 4
4 4 4 4 4 4 4 0 5 4 4 4 4 4 4 4
4 4 4 4 4 4 4 4 4 4 4 4 4 4 4 4
4 4 4 4 4 4 4 4 4 4 4 4 4 4 4 4
4 4 4 4 4 4 4 4 4 4 4 4 4 4 4 4
4 4 4 4 4 4 4 4 4 c 4 4 4 0 5
4 c 0 5 4 c 4 c 4 4 4 c 4 4 4 c
0 5 4 4 4 4 4 4 4 4 4 4 4 c c
4 4 4 4 4 c 4 4 4 4 4 c 0 5 4 4
```

Fig. 18G control.1

```
c 8 4 4 0 4 4 4 0 4 4 4 8 c 8 c
4 8 4 8 4 8 c 5 e 8 c 8 c 5 e 8
c 5 e 8 c 5 e 8 c 5 e 8 c 8 c 5
e 8 c 5 e 8 c 5 e 8 c 5 e 8 c 5
e 8 c 5 e 8 c 5 e 8 8 8 8 c c c
c c 8 c c d 5 a d 4 e 8 d 5 a d
4 e 8 d 5 a d 5 e 8 c c 8 c c d
5 4 4 4 4 4 4 4 8 d 5 c 5 5 4 4
4 4 4 4 4 e b a c c c e 8 c 4 5
5 a c 4 5 5 e 8 d 4 4 4 4 4 4 4
8 d 8 4 a c 4 8 5 5 a c 5 5 e 8
d 4 4 4 4 4 4 4 a c 4 4 4 5 5
a c 4 0 4 4 5 5 e 8 d 4 e 8 c c
c c c c 8 c 8 c 4 a c c 4 a c
c c d 5 a d 5 4 4 4 4 4 4 4 a c
d 4 4 4 8 d 4 4 4 4 8 c c c c
```

Fig. 18H control.2

```
a c 0 3 3 0 6 3 3 3 3 6 0 a 0 a
0 f 0 f 0 0 a 6 9 0 a 0 a 6 9 0
a 6 9 0 a 6 9 0 a 6 9 0 a 0 a 6
9 0 a 6 9 0 a 6 9 0 a 6 9 0 a 6
9 0 a 6 9 0 a 6 9 c f f 0 a b b
b b 0 a c a 6 0 a 3 9 0 a 6 0 a
3 9 0 a 6 0 a 6 9 f b b 0 a 2 5
6 3 3 3 3 3 3 3 0 a 6 0 6 6 3 3
3 3 3 3 3 f f 0 a 0 5 9 0 5 6 6
6 0 5 6 6 6 9 0 a 3 3 3 3 3 3 3
0 5 f 6 0 a 6 f 6 6 0 5 6 6 9 0
a 3 3 3 3 3 3 3 6 0 a 3 3 6 6 6
0 5 6 3 3 6 6 6 9 0 a 3 9 0 a 4
c a a c a 0 a 0 a 6 0 a 5 6 0 a
a 0 5 6 0 a 6 3 3 3 3 3 3 3 0 a
a 3 3 3 3 0 a 3 3 3 3 0 a c c c
```

Fig. 18I control.3

```
1 4 0 0 c 0 c 0 c 0 0 c c 1 5 c
0 d 0 e 0 f c 4 5 0 1 6 c 0 6 0
d 4 5 1 d 1 6 1 e 4 5 2 1 7 e 2
6 2 e 2 7 2 c 0 7 0 d 1 7 1 f 4
5 3 f 3 6 3 f 3 7 3 2 3 4 0 1 2
3 0 5 5 f 0 2 8 1 0 8 8 1 3 9 2
0 9 9 0 3 a 1 2 a a 8 9 5 5 e 8
9 0 0 0 0 0 0 0 b 8 9 0 a a 0 0
0 0 0 0 0 0 c f c d c f f c b 1
1 d b c 2 2 d d d 0 0 0 0 0 0 0
d f f d d b c 6 1 1 e 6 2 2 e e
e 0 0 0 0 0 0 0 f e 6 0 0 6 d d
f c b 6 0 6 e e f f 0 0 f 5 5 d
0 7 4 f d 2 e 3 c b 6 6 c b 7 6
4 f 1 2 6 1 2 0 0 0 0 0 0 0 2 6
6 0 0 0 0 0 7 0 0 0 0 1 4 f 0 0
```

Fig. 18J log_hi

```
0 5 1 0 b f c a e 5 a 8 9 6 4 b
8 6 6 f 4 4 6 2 9 3 1 9 3 e 5 f
2 a 8 0 0 f 3 a 5 e e d 5 0 c 2
4 1 2 d b 0 1 4 8 d 8 1 6 f 9 0
d b 3 5 2 1 5 b 3 a 9 1 c d 4 b
f d c 8 9 9 d 7 1 f a d 9 6 c c
e 0 6 b c 3 3 7 7 5 a e 1 b e a
2 d c 7 2 0 b b 0 0 9 4 8 3 a 0
b 7 5 2 4 e f 1 c c a b f f 9 5
0 e 4 9 b 3 b 8 7 8 6 7 e 7 c 6
1 9 7 b 9 6 2 1 3 2 f 3 7 3 f 1
5 c 9 9 c 4 7 0 3 2 6 0 6 a e 6
1 8 a 7 2 0 5 f 6 e 1 d d c d 2
7 1 f 7 8 4 8 5 b f 2 6 8 c 0 4
7 c 7 5 4 6 2 3 d d e a 5 8 2 5
d a a 8 3 4 e 8 3 e 9 d 4 e 4 a
```

Fig. 18K log_lo

```
0 f 6 2 8 e c 4 8 b 1 3 5 f 7 5
b c 6 d 4 c 1 6 f 8 2 e a 9 8 6
e d 4 f 9 0 5 0 6 6 e 8 5 4 8 5
2 4 3 a 4 a d 1 8 c c 8 5 a 9 3
0 9 e 0 7 c a 1 f b 3 0 e 7 3 d
8 6 a 9 1 4 9 b f 7 6 3 6 b 7 0
4 1 4 6 5 d b d 2 7 c b 9 f 3 7
b b b f f c 0 a d 8 d 5 f c 5 6
c 3 c a 6 0 2 3 9 3 9 e c b 7 4
b 1 e 2 3 6 2 2 1 0 7 a 5 5 2 0
7 b 9 7 c d c b 4 8 1 7 c 1 3 e
e 1 a 8 f 9 6 5 9 9 9 e a 2 c 3
a 7 3 0 1 7 9 4 8 f 1 f d 4 2 0
4 5 9 8 5 f e 1 b 5 d 2 6 6 0 a
7 d e 2 d e 2 0 1 5 2 e 3 a 4 d
4 f a d 3 0 7 1 2 a 0 e 8 d b 8
```

Fig. 18L antilog_hi

```
d 6 0 3 2 b 7 c 7 2 3 9 7 7 b 2
4 c 1 8 3 d 0 a 3 6 c a 4 3 a 5
c c e 3 e 2 1 4 a b 8 7 a d 2 7
e a f f a 2 9 a 1 b 1 6 7 6 4 4
f 3 3 4 1 7 8 0 f b d f 1 e 9 d
4 d e e 8 2 2 6 1 c 4 0 8 e b 0
9 1 d b 6 3 1 9 c b b 5 1 a e 0
c 9 6 8 d 9 b e d a 9 5 a 6 e 7
9 f 9 0 2 d d c 3 5 e 1 3 f d 7
f 5 9 4 5 0 5 8 b 3 b a a 7 1 1
2 0 b c 0 7 5 6 f 8 f 4 6 2 e f
7 4 9 9 3 0 6 a 0 4 7 d 8 4 8 6
5 b 9 8 c 6 d 5 2 8 5 7 0 e 4 b
4 e c 5 f e 5 4 2 5 3 7 3 c f c
8 9 e 6 6 9 2 f 0 1 f 6 b f 2 c
2 a 8 a c d 1 5 5 d 3 8 8 1 0 d
```

*Fig.* 18M antilog_lo

```
e 1 3 f d 7 f 5 9 4 5 0 5 8 b 3
b a a 7 1 1 2 0 b c 0 7 5 6 f 8
f 4 6 2 e f 7 4 9 9 3 0 6 a 0 4
7 d 8 4 8 6 5 b 9 8 c 6 d 5 2 8
5 7 0 e 4 b 4 e c 5 f e 5 4 2 5
3 7 3 c f c 8 9 e 6 6 9 2 f 0 1
f 6 b f 2 c 2 a 8 a c d 1 5 5 d
3 8 8 1 0 d 6 0 3 2 b 7 c 7 2 3
9 7 7 b 2 4 c 1 8 3 d 0 a 3 6 c
a 4 3 a 5 c c e 3 e 2 1 4 a b 8
7 a d 2 7 e a f f a 2 9 a 1 b 1
6 7 6 4 4 f 3 3 4 1 7 8 0 f b d
f 1 e 9 d 4 d e e 8 2 2 6 1 c 4
0 8 e b 0 9 1 d b 6 3 1 9 c b b
5 1 a e 0 c 9 6 8 d 9 b e d a 9
5 a 6 e 7 9 f 9 0 2 d d c 3 5 e
```

*Fig.* 18N archyp_hi

```
0 0 0 0 2 0 0 0 6 0 4 2 4 6 5 0
0 0 7 0 2 7 0 3 0 3 0 6 2 3 0 1
0 0 0 0 0 5 0 1 6 2 1 6 0 0 0 0
0 0 0 0 2 0 6 0 5 1 0 0 5 0 1 2
5 2 0 0 0 1 6 3 0 0 0 0 0 0 7 7
0 0 5 3 0 0 0 0 0 0 1 6 1 0 0 4
0 0 0 0 0 3 0 0 0 0 2 0 0 0 0 2
7 5 4 0 3 7 0 0 3 0 0 0 0 0 7 4
2 4 1 0 0 3 5 6 0 0 0 0 0 0 6 0
0 0 0 0 0 5 0 4 0 0 7 5 0 0 2
0 6 5 4 0 0 0 7 1 0 0 3 0 0 0 0
6 6 5 0 0 0 0 0 0 5 7 4 0 0 7
7 0 5 6 0 4 5 1 2 0 4 0 4 1 4 0
4 0 0 0 0 4 4 0 7 0 3 0 1 1 5 0
1 3 0 0 2 7 6 1 2 0 7 0 0 0 0 0
7 0 3 3 3 0 0 6 0 0 0 3 0 2 0 0
```

*Fig.* 18O archyp_lo

ERROR DETECTION AND CORRECTION IN DIGITAL COMMUNICATION SYSTEMS

The present invention relates to error detection and correction in digital communication systems and particularly to the correction of double errors in multi-channel digital data communication systems using a Reed-Solomon code.

The present invention finds particular application to error correcting systems of the sort generally described in Berlekamp U.S. Pat. No. 4,162,480, issued July 24, 1979 for Galois Field Computer. Portions of that reference will be repeated herein at some length and the rest is hereby incorporated herein by reference.

BACKGROUND OF THE INVENTION

Information transmitted over a communication channel, including a tape recorder, is generally received as a combination of the original information signal and a noise component. Integrity of the information content is almost entirely preserved when the signal to noise ratio of the system is large. Accordingly, refinements in design and realization of the appropriate hardware can increase the probability of error-free transmission, theoretically up to the limits imposed by the channel itself. In order to minimize the effect of intrinsic channel limitations, various techniques are employed which ultimately require a compromise between bandwidth and information transfer rate. Various limitations imposed on the channel bandwidth, information rate, and the degree of complexity of receiving and transmitting apparatus contribute to a probable error rate.

Although redundancy is a common element among these techniques, mere repetition exacts a heavy penalty in transmission rate. For example, a single repetition reduces the information rate 50 percent and a second repetition (to implement majority logic) reduces the information rate by 66⅔ percent. Other means for assuring message integrity have employed sophisticated coding techniques which permit the detection, location, and correction of errors. Among the desiderata of these coding techniques are high information rate and a capability of correcting multiple errors within any given codeword of transmitted data.

In this context a codeword of n elements results from encoding operations performed upon the elements of the original data comprising K elements to yield an encoded word ("codeword") of information having K information elements and n−K check elements. The encoded redundancy in the form of n−K check elements is then available during the decoding operations to detect and correct errors in the codeword (including all information and check elements) up to some limit or merely to detect errors up to some larger limit.

Many such codes, having distinct mathematical properties, have been studied, and mathematically efficient encoding and decoding procedures have been devised, but reduction to practice with concomitant efficiency requires a special purpose computer. For example, certain classes of codes are founded on association of each information element of a codeword with an element of a Galois field. Very briefly, the Galois field is a finite field defined by a field generator, the elements of which field may be represented as polynomials in a particular primitive field element, with coefficients in the prime subfield. If the coefficients are presented in bit-serial form with the most significant coefficient first, field elements can be considered polynomials in z, where $z^{-1}$ is the delay operator.

Encoding is done by adding redundant elements to the source data elements in order to make the resulting codeword satisfy prescribed parity checks. Each prescribed parity check is formed as a weighted sum of the elements in the codeword. The result of each prescribed parity check upon decoding is generally referred to as a syndrome. In the absence of errors for a linear code, all the syndromes are zero, meaning that the weighted sum of the elements forming each parity check is zero, and the presence of errors is recognized by a nonzero syndrome. In the absence of errors for the coset code of a linear code, all the syndromes have some prescribed nonzero values, and the presence of errors is recognized by departures from the prescribed nonzero values. Cyclic codes, such as Reed-Solomon codes, are a subset of linear codes. The elements of a cyclic codeword can be associated with coefficients of a codeword polynomial. The formation of parity checks can be equated with the taking of a remainder upon division of the codeword polynomial by the code generator polynomial for the code. The locations of errors and the true value of the erroneous information elements are determined after constructing certain polynomials defined on the Galois field and finding the roots of these polynomials. An encoder and decoder are, therefore, required which have the capability of performing Galois field arithmetic.

The same parity check circuit may be used for encoding and decoding, that is, for generating parity and syndrome bytes. In encoding, the data may be taken in data blocks and associated with coefficients of what may be called a data polynomial. The formation of parity checks can be performed identically as in the case of codewords to determine whether or not the data polynomial itself is divisible by the code generator polynomial. If not, the remainder is added to the data polynomial to form the codeword polynomial. Thus the remainder, whether parity or syndrome bytes, may be referred to as a parity check. For the same reasons, the term "data block" refers to corresponding coefficients of the data polynomial, the codeword polynomial, or a received polynomial, as the case may be.

Of the error correcting codes, a particular class of such codes, separately described by Bose, Chaudhuri and Hocquenhem (thus "BCH" codes), are capable of multiple error correction. Special cases of such codes are the Reed-Solomon (RS) codes with respect to which the present invention will be described.

The Berlekamp patent includes a review of the salient aspects of coding theory, applicable to BCH codes in general and to RS codes in particular. As a general reference, Berlekamp, Algebraic Coding Theory (McGraw-Hill, 1968), is recommended. In a binary realization, such codes may be regarded as having three principal positive integer parameters, n, m, and t, where n is the total length in m-bit characters of a word of encoded information, $n = 2^m - 1$, and t is the error correcting capability of the code. Assuming no fewer than 2t redundant characters or check characters, such a codeword is capable of providing sufficient informational redundancy to detect and correct any set of t or fewer independent errors within the codeword of encoded information, or to correct any set of 2t or fewer independent erasures. An erasure may be defined as an error of known location within the received codeword.

The present invention is directed to correcting double errors or fewer.

The properties of an algebraic finite field may be summarized briefly. For the purposes of the present invention, a field may be informally defined as a set of elements including the null element, 0, and the unit element, â⁰, upon which are defined operations of addition, multiplication and division. Addition and multiplication are associative and commutative, and multiplication is distributive with respect to addition. Every element of the field has a unique negative such that the negative of a given element summed with that given element itself yields the null or 0. Further, every non-zero element has a unique reciprocal such that the product of such an element with its reciprocal yields the unit element, â⁰. The elements comprising the field may be considered symbolic representations of binary or ternary or q-ary numbers. The description of the invention will be understood best in terms of a field of characteristic two.

The general finite field is called the Galois field and is specified by two parameters, a prime p, and an integer m, whereby $GF(p^m)$ describes a unique finite field (the Galois field of order $p^m$) having $p^m$ elements. In such a field all operations between elements comprising the field yield results which are again elements of the field. For example, the operation of addition carried out on elements of the finite field GF(2) is defined, modulo 2, according to relations which do not admit of a "carry". Thus, the binary addition tables are: $0+1=1+0=1$ and $0+0=1+1=0$. Arithmetically, this is a "carry-less" addition, sometimes referred to as half addition and more commonly denoted as the exclusive-OR (XOR). It is apparent that absence of a carry thereby limits the magnitude of the resulting sum to the finite field.

The mathematical basis of Reed-Solomon codes and decoding thereof, as discussed in greater detail in Chapter 10 of Algebraic Coding Theory is as follows:

Let $â^b$ be a primitive element in $GF(2^m)$. (Conventionally, the primitive is a power of alpha, but not having the capability of typing alpha, we use the symbol â to represent alpha. Sometimes it is termed gamma.) The code generator polynomial is defined by $$g(x) = \sum_{i=f}^{f+d-2} (x + â^{ib}) \quad (1)$$

where b, d, f and i are integers and d is the code's designed distance.

Although the particular embodiment set forth in detail herein is for 8-bit operation, a particular 4-bit field, $GF(2^4)$ or $GF(16)$, having fewer terms, can serve as an illustrative example. This particular 4-bit Galois field is that developed by the field generator:

$$G_f(z) = z^4 + z + z1 \quad (2)$$

with a primitive element $$â = 0z^3 + 0z^2 + 1z^1 + 0z^0. \quad (3)$$

The Galois arithmetic is thus modulo $z^4 + z + 1$. The consequence of this is that there are 15 numbers in the Galois field, in addition to null, 0000, all being powers of â from 0 to 14 that can be stated as third order polynomials in the form $$F_3z^3 + F_2z^2 + F_1z^1 + F_0z^0$$

where the coefficients are binary 0 or 1 as set forth in Table I:

TABLE I

|        | $z^3$ | $z^2$ | $z^1$ | $z^0$ |
|--------|-------|-------|-------|-------|
| $â^0 =$  | 0 | 0 | 0 | 1 |
| $â^1 =$  | 0 | 0 | 1 | 0 |
| $â^2 =$  | 0 | 1 | 0 | 0 |
| $â^3 =$  | 1 | 0 | 0 | 0 |
| $â^4 =$  | 0 | 0 | 1 | 1 |
| $â^5 =$  | 0 | 1 | 1 | 0 |
| $â^6 =$  | 1 | 1 | 0 | 0 |
| $â^7 =$  | 1 | 0 | 1 | 1 |
| $â^8 =$  | 0 | 1 | 0 | 1 |
| $â^9 =$  | 1 | 0 | 1 | 0 |
| $â^{10} =$ | 0 | 1 | 1 | 1 |
| $â^{11} =$ | 1 | 1 | 1 | 0 |
| $â^{12} =$ | 1 | 1 | 1 | 1 |
| $â^{13} =$ | 1 | 1 | 0 | 1 |
| $â^{14} =$ | 1 | 0 | 0 | 1 |

The cycle repeats in both directions, i.e., $â^{15} = â^0$, etc., and $â^{-1} = â^{14}$, etc. All coefficients of the data polynomial, the codeword polynomial, the received polymomial and the code generator polynomial are thus in the Galois field, in powers of the primitive â. In the example below for $GF(2^8)$ or $GF(256)$ there are eight bits to each term, with a different field generator and primitive â.

The block length of the Reed-Solomon code is $n = 2^m - 1$. The codewords consist of all polynomials of degrees less than n which are multiples of g(x). There are k information elements and h−k check elements. The code is thus RS(n,k).

Let C(x) be the transmitted codeword, divisible by g(x), $$C(x) = \sum_{i=0}^{n-1} c_i x^i. \quad (4)$$

where i is an integer and the coefficients $c_i$ are powers of the primitive â in the Galois field. If the channel noise adds to this codeword, the error pattern is $$E(x) = \sum_{i=0}^{n-1} e_i x^i, \quad (5)$$

and the received word is $$R(x) = \sum_{i=0}^{n-1} r_i x^i = C(x) + E(x). \quad (6)$$

The received codeword may be passed through a re-encoder (also known as a syndrome generator) which produces as its output the remainder of the polynomial division $$s(x) = \text{Remainder } [R(x)/g(x)]. \quad (7)$$

Because C(x) is a multiple of g(x), its division thereby leaves zero remainder. Hence $$s(x) = \text{Remainder } [E(x)/g(x)]. \quad (8)$$

From such remainder may be derived the weighted power-sum symmetric functions defined by $$S_{ib} = s(â^{ib}) = e(â^{ib}) \quad (9)$$

from which may be derived the location and nature of any errors, and appropriate corrections can be made, all described in the Berlekamp patent.

In order to perform such error correction, it is necessary to encode the source data into codewords and to identify errors in the recovered codewords. This is done by adding parity bytes to the bytes of source data to generate codewords satisfying certain parity checks and by identifying departures from such parity checks in the recovered codewords as syndromes.

The Berlekamp patent describes effective methods and apparatus for correcting multiple errors and has been utilized successively in correcting up to six errors in an RS(255, 243) code. However, the Berlekamp process is time consuming. At high speeds it sometimes takes longer to correct errors in a received word than to transmit the next word. This means that it is necessary to store data for later corrections, which may eventually lead to exceeding storage capacity, or to slowing down the transmission rate. Both alternatives are undesirable, as it is important to transmit as fast as possible with corrections made in real time.

SUMMARY OF THE INVENTION

The present invention provides a simplified and much less expensive apparatus for correcting single and double errors in a received data block utilizing a Reed-Solomon code or noting the presence of any greater number of errors without correcting any. The invention has application where there are not too many occasions of greater than two errors per data block and has the great advantage over the apparatus and methods disclosed by Berlekamp of being able to correct the errors in real time at 14.6M bytes/sec.

The particular implementation of the invention as described below is based upon the properties of the particular code generated by the encoder. For other codes, the apparatus would be modified within the precepts of the present invention. A particular circuit will be described for a Reed-Solomon (255, 243) code, that is, one in which the data stream consists of codewords 255 bytes long, of which 12 bytes are parity bytes. In the above notation, $n = 2^m - 1 = 255$, $m = 8$. In such a code, the codewords will be in the form of the polynomial of 8-bit bytes of the form:

$$C(x) = c_{254}x^{254} + c_{253}x^{253} \ldots + c_1 x^1 + c_0 \quad (10)$$

Every codeword (without errors) is a multiple of the generator polynomial, i.e., every codeword can be divided exactly by the generator with zero remainder. The generator itself is a 12th order polynomial in the form $$g(x) = g_{12}x^{12} + g_{11}x^{11} \ldots + g_1 x^1 + g_0 \quad (11)$$

which in turn is the product of 12 factors $$g(x) = (x + a^f)(x + a^{f+1}) \ldots (x + a^{f+11}) \quad (12)$$

In the particular example set forth below, $f = 122$. Every codeword can therefore be divided exactly by any one of these first order factors to give zero remainder.

The actual encoding is performed in a usual manner by dividing the data block by the generator polynomial $G(x)$ with the check bytes set equal to zero. The bytes of the remainder are the check bytes which, when added to the data block, form the codeword $C(x)$. The word as received $R(x)$ is then divided by the same generator polynomial $g(x)$ to form a remainder, the syndrome $s(x)$, which provides the error information. In the case of RS (255, 243), this is a twelfth order syndrome from which, as stated above, the respective weighted power sums may be derived. Such weighted power sums may also be developed by dividing the received word $R(x)$ by the respective factors of the code generator polynomial $g(x)$ and taking the remainder, forming respective first order syndromes $S_i$:

$$S_i = \text{Remainder } [R(x)/(x + a^i)] = \sum_{j=0}^{n-1} r_j a^{ij} \quad (13)$$

From Equations (4) to (9) above, it is evident that each first order syndrome $S_i$ is also equal to the division of the error pattern $E(x)$ by the respective factor:

$$S_i = \text{Remainder } [E(x)/(x + a^i)] = \sum_{j=0}^{n-1} e_j a^{ij} \quad (14)$$

The errors $e_j$ at each term of the received signal in error is the difference between the transmitted term $c_i$ and the corresponding received term $r_i$. By taking a plurality of different first order syndromes, the errors $e_j$ and their locations j can be determined by solving a set of simultaneous equations, and the errors can then be corrected by subtracting (the same as adding in the Galois field) the errors $e_j$ from the respective coefficients of the received signals to provide corrected signals in the form of the transmitted codeword. See Equation (6).

More particularly, in accordance with the present invention, two errors may be corrected, provided there are no more than two errors in a received data block. According to the present invention, the locations of the two errors in the received data block are defined relative to a reference byte (coefficient) h as being k bytes from the reference byte. That is, the reference is halfway between the bytes in error. The erroneous bytes are thus located at bytes $h-k$ and $h+k$, the errors in such bytes being in the above notation $e_{h-k}$ and $e_{h+k}$. It should be noted that the RS codes are cyclical codes, so that the next term following the last is the first; that is, the term following $C_0$ is $c_{n-1}$, or in RS (255, 243), after $c_0$ is $c_{254}$. The midpoint h may thus be on either side of an erroneous byte, being on the side where the midpoint falls, as is determined by where there is an odd number of bytes between the errors in the block, for there can be no midpoint byte where there is an even number of bytes between errors. As the total number of bytes is odd, there must be a midpoint on one side or the other.

From Equation (14), when there are two and only two errors in a data block, $$S_i = e_{h+k} â^{i(h+k)} + e_{h-k} â^{i(h-k)} \quad (15)$$

$S_i$ is determined as above for each of four different factors of the code generator polynomial. This provides four simultaneous independent equations in four unknowns, h, k, $e_{h+k}$ and $e_{h-k}$, which may be solved for the unknowns. In accordance with the present invention the equations are solved indirectly by solving for particular functions of h and k in the Galois field, namely $â^h$ and $(â^k + â^{-k})$ and then converting by look-up tables to find h and k, from which may be determined the the error locations $h+k$ and $h-k$. More particularly, the four Equations (15) may be solved for $\hat{a}^h$ and $(\hat{a}^k + \hat{a}^{-k})$:

$$\hat{a}^h = F_1(S_{i1}, S_{i2}, S_{i3}, S_{i4}) \tag{16}$$

and $$\hat{a}^k + \hat{a}^{-k} = F_2(S_{i1}, S_{i2}, S_{i3}, S_{i4}) \tag{17}$$

where $S_{i1}$, $S_{i2}$, $S_{i3}$ and $S_{i4}$ are respective first order syndromes.

Because the particular circuit is designed for 8-bit operations, the arithmetic is performed in a Galois field $GF(2^8)$ or $GF(256)$. Such arithmetic will be discussed further below in connection with the description of a preferred embodiment for RS(255, 243). The particular syndromes for such example are $S_{126}$, $S_{127}$, $S_{128}$ and $S_{129}$.

The syndromes $S_{126}$, $S_{127}$, $S_{128}$ and $S_{129}$ may be derived by dividing the received data block $R(x)$ polynomial by the respective factor of the code generator polynomial, Equation (13). This division is effected by the circuitry described below to develop signals corresponding to these four syndromes. Syndrome $S_{130}$ is also developed for checking error calculations.

$$S_{126} = Rem\left[\frac{R(x)}{x + \hat{a}^{126}}\right] = \sum_{j=0}^{254} r_j \hat{a}^{126j} \tag{18}$$

$$S_{127} = Rem\left[\frac{R(x)}{x + \hat{a}^{127}}\right] = \sum_{j=0}^{254} r_j \hat{a}^{127j} \tag{19}$$

$$S_{128} = Rem\left[\frac{R(x)}{x + \hat{a}^{128}}\right] = \sum_{j=0}^{254} r_j \hat{a}^{128j} \tag{20}$$

$$S_{129} = Rem\left[\frac{R(x)}{x + \hat{a}^{129}}\right] = \sum_{j=0}^{254} r_j \hat{a}^{129j} \tag{21}$$

$$S_{130} = Rem\left[\frac{R(x)}{x + \hat{a}^{130}}\right] = \sum_{j=0}^{254} r_j \hat{a}^{130j} \tag{22}$$

Once these syndromes are found, it is possible to solve for two error values and their locations using Galois field arithretic. If the syndromes are all equal to zero there are no errors in the codeword. From Equation (15), the four independent equations in four unknowns h, k, $e_{h+k}$ and $e_{h-k}$ may be set up as:

$$S_{126} = e_{h+k}\hat{a}^{126(h+k)} + e_{h-k}\hat{a}^{126(h-k)} \tag{23}$$

$$S_{127} = e_{h+k}\hat{a}^{127(h+k)} + e_{h-k}\hat{a}^{127(h-k)} \tag{24}$$

$$S_{128} = e_{h+k}\hat{a}^{128(h+k)} + e_{h-k}\hat{a}^{128(h-k)} \tag{25}$$

$$S_{129} = e_{h+k}\hat{a}^{129(h+k)} + e_{h-k}\hat{a}^{129(h-k)} \tag{26}$$

The solution for h may be derived from functions $P_1$ and $P_2$ as defined below.

$$P_1 = S_{126}S_{128} + S_{127}^2 \tag{27}$$

$$= e_{h+k}^2\hat{a}^{254(h+k)} + e_{h-k}^2\hat{a}^{254(h-k)} + e_{h+k}e_{h-k}\hat{a}^{254h-2k} + \tag{28}$$

$$e_{h+k}e_{h-k}\hat{a}^{254h+2k} + e_{h+k}^2\hat{a}^{254(h+k)} + e_{h-k}^2\hat{a}^{254(h-k)}$$

$$= e_{h+k}e_{h-k}\hat{a}^{254h}(\hat{a}^{2k} + \hat{a}^{-2k}) \tag{29}$$

$$= e_{h+k}e_{h-k}\hat{a}^{254h}(\hat{a}^k + \hat{a}^{-k})^2 \tag{30}$$

$$P_2 = S_{127}S_{129} + S_{128}^2 \tag{31}$$

$$= e_{h+k}^2\hat{a}^{h+k} + e_{h-k}^2\hat{a}^{h-k} + e_{h+k}e_{h-k}\hat{a}^{h-2k} + \tag{32}$$

$$e_{h+k}e_{h-k}\hat{a}^{h+2k} + e_{h+k}^2\hat{a}^{h+k} + e_{h-k}^2\hat{a}^{h-k}$$

$$= e_{h+k}e_{h-k}\hat{a}^{h}(\hat{a}^{2k} + \hat{a}^{-2k}) \tag{33}$$

$$= e_{h+k}e_{h-k}\hat{a}^{h}(\hat{a}^k + \hat{a}^{-k})^2 \tag{34}$$

$$\frac{P_2}{P_1} = \frac{\hat{a}^h}{\hat{a}^{254h}} = \hat{a}^{-253h} = \hat{a}^{2h} = (\hat{a}^h)^2 \tag{35}$$

$$\hat{a}^h = \sqrt{\frac{P_2}{P_1}} \tag{36}$$

Thus, h is given by $$h = \log_{\hat{a}}\hat{a}^h = \log_{\hat{a}}\sqrt{\frac{P_2}{P_1}} \tag{37}$$

The solution for k may be derived from functions $P_1$, $P_2$ and $P_3$, which is defined below.

$$P_3 = S_{126}S_{129} + S_{127}S_{128} \tag{38}$$

$$= e_{h+k}^2\hat{a}^0 + e_{h-k}^2\hat{a}^0 + e_{h+k}e_{h-k}\hat{a}^{-3k} + e_{h+k}e_{h-k}\hat{a}^{3k} + \tag{39}$$

$$e_{h+k}^2\hat{a}^0 + e_{h-k}^2\hat{a}^0 + e_{h+k}e_{h-k}\hat{a}^{-k} + e_{h+k}e_{h-k}\hat{a}^{k}$$

$$= e_{h+k}e_{h-k}(\hat{a}^{-3k} + \hat{a}^{3k} + \hat{a}^{-k} + \hat{a}^k) \tag{40}$$

$$= e_{h+k}e_{h-k}(\hat{a}^k + \hat{a}^{-k})^3 \tag{41}$$

$$\frac{P_1P_2}{P_3^2} = \frac{e_{h+k}^2 e_{h-k}^2(\hat{a}^k + \hat{a}^{-k})^4}{e_{h+k}^2 e_{h-k}^2(\hat{a}^k + \hat{a}^{-k})^6} \tag{42}$$

$$= (\hat{a}^k + \hat{a}^{-k})^{-2} \tag{43}$$

$$\hat{a}^k + \hat{a}^{-k} = \sqrt{\frac{P_3^2}{P_1P_2}} \tag{44}$$

Thus, the value of k, and hence the two error locations can be found by solving Equation (44). The function that solves Equation (44) for the variable k is called "archyp" by definition herein. In the circuit utilized, this function is implemented by a lookup table in a PROM ARCHYP. If there are no solutions to the equation there are more than two errors in the received codeword.

The solution of the error values takes a different approach. Given the values of h and k, the solution proceeds as follows:

$$S_{127}^2 = e_{h+k}^2\hat{a}^{-(h+k)} + e_{h-k}^2\hat{a}^{-(h-k)} \tag{45}$$

$$S_{128}^2 = e_{h+k}^2\hat{a}^{h+k} + e_{h-k}^2\hat{a}^{h-k} \tag{46}$$

$$\hat{a}^{h+k}S_{127}^2 = e_{h+k}^2\hat{a}^0 + e_{h-k}^2\hat{a}^{2k} \tag{47}$$

$$\hat{a}^{-(h+k)}S_{128}^2 = e_{h+k}^2\hat{a}^0 + e_{h-k}^2\hat{a}^{-2k} \tag{48}$$

$$\hat{a}^{h+k}S_{127}^2 + \hat{a}^{-(h+k)}S_{128}^2 = e_{h-k}^2(\hat{a}^{2k} + \hat{a}^{-2k}) \tag{49}$$

$$e_{h-k}^2 = \frac{\hat{a}^{h+k}S_{127}^2 + \hat{a}^{-(h+k)}S_{128}^2}{(\hat{a}^k + \hat{a}^{-k})^2} \tag{50}$$

$$e_{h-k} = \sqrt{\frac{\hat{a}^{h+k}S_{127}^2 + \hat{a}^{-(h+k)}S_{128}^2}{(\hat{a}^k + \hat{a}^{-k})}} \quad (51)$$

$$\hat{a}^{h-k}S_{127}^2 = e_{h+k}^2 \hat{a}^{-2k} + e_{h-k}^2 \hat{a}^0 \quad (52)$$

$$\hat{a}^{-(h-k)}S_{128}^2 = e_{h+k}^2 \hat{a}^{2k} + e_{h-k}^2 \hat{a}^0 \quad (53)$$

$$\hat{a}^{h-k}S_{127}^2 + \hat{a}^{-(h-k)}S_{128}^2 = e_{h+k}^2(\hat{a}^{-2k} + \hat{a}^{2k}) \quad (54)$$

$$e_{h+k}^2 = \frac{\hat{a}^{h-k}S_{127}^2 + \hat{a}^{-(h-k)}S_{128}^2}{(\hat{a}^k + \hat{a}^{-k})^2} \quad (55)$$

$$e_{h+k} = \sqrt{\frac{\hat{a}^{h-k}S_{127}^2 + \hat{a}^{-(h-k)}S_{128}^2}{(\hat{a}^k + \hat{a}^{-k})}} \quad (56)$$

Thus, there is an error of value $e_{h+k}$ at location $h+k$, and an error of value $e_{h-k}$ at location $h-k$. This solution is dependent, however, upon there being two and only two errors in a received data block. If there are more than two errors, equations (23) to (26) are not true, and the solution to the four simultaneous equations is not correct. If the solution be correct, the similar equation for other first order syndromes will be correct. The validity of the solution, and hence a determination that there are but two errors per received data block, may be checked by substituting the solution into the following equation $$S_{130} = e_{h+k}\hat{a}^{130(h+k)}e_{h-k}\hat{a}^{130(h-k)} \quad (57)$$

and comparing the calculated result with value of the detected syndrome $S_{130}$, Equation (22).

If the relation be not valid, there were more than two errors in the received codeword.

There remains the case where there is but a single error in a received data block. If the syndromes are nonzero and $P_1$, $P_2$ and $P_3$ are equal to zero, there is only one error in the received data block (Equations (30), (34) and (41)), and the solution proceeds as follows:

Assuming one error at location $j$, the error value $e_j$ in relation to each syndrome is, from Equation (14), $$S_{127} = e_j\hat{a}^{127j} \quad (58)$$

$$S_{128} = e_j\hat{a}^{128j} \quad (59)$$

The location $j$ and error $e_j$ may then be derived:

$$\frac{S_{128}}{S_{127}} = \frac{e_j\hat{a}^{128j}}{e_j\hat{a}^{127j}} \quad (60)$$

$$= \hat{a}^j \quad (61)$$

$$j = \log_{\hat{a}}\hat{a}^j = \log_{\hat{a}}S_{128} - \log_{\hat{a}}S_{127} \quad (62)$$

$$S_{127}S_{128} = e_j^2\hat{a}^{255j} = e_j^2 \quad (63)$$

$$e_j = \sqrt{S_{127}S_{128}} \quad (64)$$

Once the errors and their locations have been determined, the errors are added to the respective terms of the received data block to reconstitute the codeword as encoded.

It is thus one aspect of the present invention to utilize four first order syndromes to determine any double errors and their locations in a received Reed-Solomon encoded data block R(x) and to correct such errors provided there are no more than two errors. It is also an aspect of the invention to utilize a fifth single order syndrome to identify the presence of more than two errors in a single received data block. A further aspect is to utilize two of such syndromes to correct single errors.

Other aspects and advantages of the present invention will become apparent from the following detailed description of a preferred embodiment of the present invention, particularly when taken with the accompanying drawings.

BRIEF DESCRIPTION OF THE DRAWINGS

FIG. 2 is a block diagram of a decoder for use in the system of FIG. 1, utilizing error detection and correction circuitry in accordance with the present invention;

FIG. 3 is a block diagram of an error processor according to the present invention for use in the decoder shown in FIG. 2;

FIG. 9 is a more detailed circuit diagram of a programmer-processor for the error processor shown in FIG. 3;

FIG. 10 is a table of control bit lines output from the programmer-processor of FIG. 9;

FIG. 11 is a table indicating the function to be performed by the bus structure in the error processor shown in FIG. 3;

FIG. 12 is a table of the instruction set for performing particular ALU functions in the error processor shown in FIG. 3;

FIGS. 17A and 17B comprise a program listing for the programmer-processor shown in FIG. 3;

FIGS. 18A to 18Q are the PROM listings for respective PROMs in the decoder shown in FIG. 2, including the error processor shown in FIG. 3;

DETAILED DESCRIPTION

Figure 1:
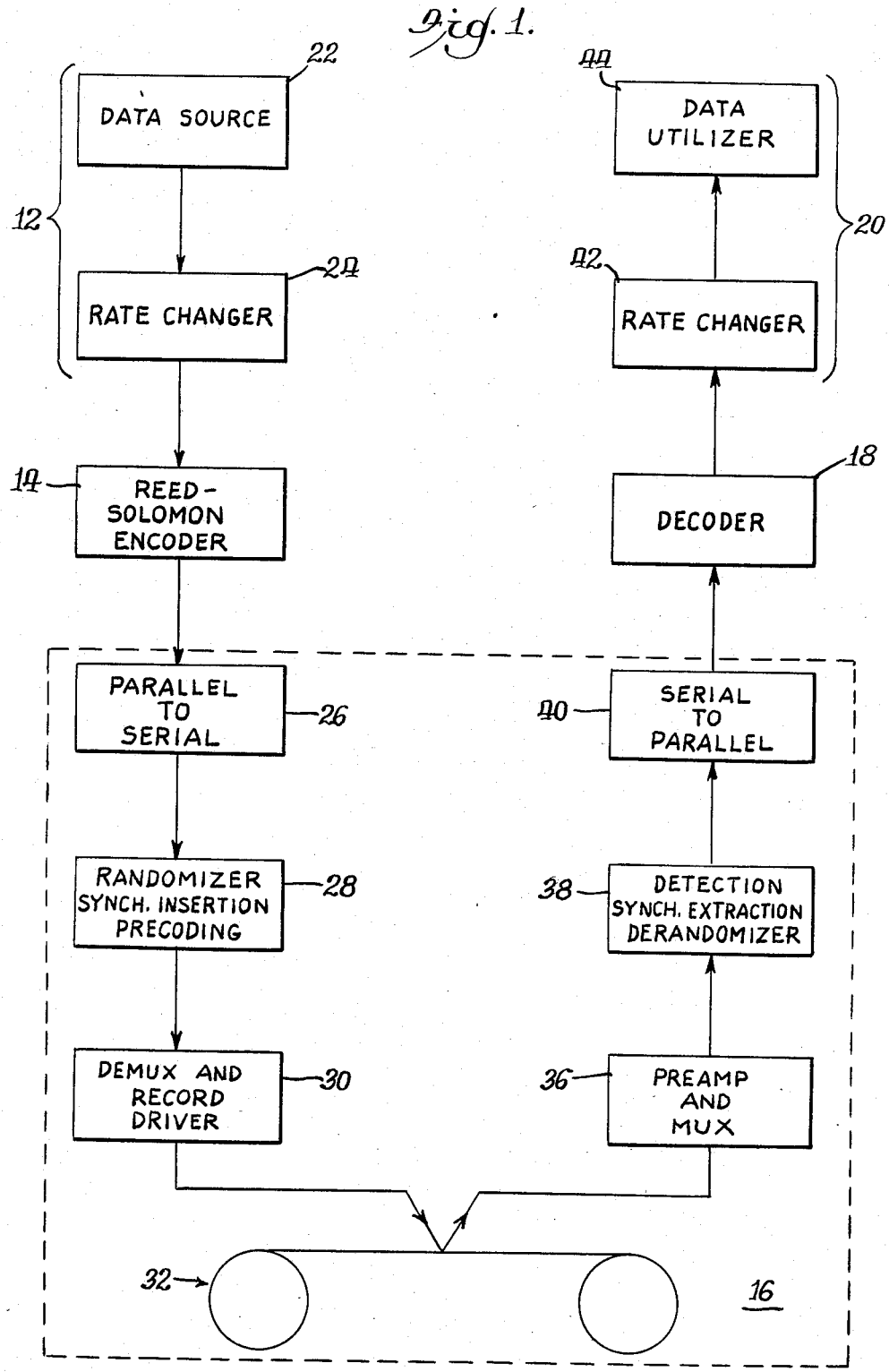
FIG. 1 is a block diagram of a data transmission system, including a Reed-Solomon encoder and decoder, in which an error detection and correction circuit according to the present invention may be used.

In FIG. 1 is illustrated in block form an example of a data transmission system in which error detection and correction circuitry according to the present invention may be used. Such data transmission system includes successively a data input section 12, a Reed-Solomon encoder 14, a data transmission system 16, a decoder 18, and a data output section 20.

In the particular example, the data input section 12 comprises a data source 22 and a rate changer 24. The data source may, for example, include a television camera and means for presenting the resultant data in digital form of parallel 8-bit bytes at a rate of 13.2 megabytes per second. The rate changer 24, by storing the data and reading it out faster than it was put in, reproduces the data at a rate of 14.6 megabytes per second with gaps in the data to accommodate parity bits inserted by the encoder 14 and synchronization words for the purposes of timing recovery.

The encoder 14 of the example is a Reed-Solomon (255, 243) encoder based upon the principles set forth above and as described in greater detail in U.S. Pat. No. 4,162,480. Such encoder forms the data into codewords 255 bytes long each containing 243 data bytes followed by 12 parity bytes in accordance with the Reed-Solomon (255, 243) code. The codewords are interleaved to a depth of 16. The codewords are then applied to the data transmission system 16 at the 14.6 megabytes per second rate.

In the transmission system 16, the codewords are converted to serial form by a parallel to serial converter 26, the resulting signal being at the rate of 116.8 megabits per second. The serial bits are applied to a randomizer, synchronization insertion and precoding section 28 which acts in a conventional manner to place the data in better form for recording, as by randomizing and inserting synchronization signals. The randomized signals are applied to a demultiplexing and record driver circuit 30 which demultiplexes the signal among the recording heads of a tape recorder 32, which acts to record the signals for later playback.

Upon playback, the recorded signals are read in analog form by pickup heads from the tape of the recorder 32 and applied to a preamplifier and multiplexing circuit 36 which receives the signals from the several pickup heads, combines them and amplifies them. These signals are applied to a detection, synchronization extraction and derandomizer section 38 which acts to convert the analog signals to digital form, remove the synchronizing signals and derandomize the signals. To the extent all has gone well in the transmission (recording and reproducing), the signals at the output of the detection, synchronization extraction and derandomizer section 38 are in the form at the input to the randomizer, synchronization insertion and precoding section 28. These signals are converted by a serial to parallel circuit 40 into the 8-bit parallel bytes as applied to the data transmission system 16.

The output of the data transmission system is decoded by the decoder 18. The decoder 18 includes a re-encoder and is based in part upon the principles set forth above and as described in greater detail in the U.S. Pat. No. 4,162,480. Such decoder removes the parity bits and corrects the data for errors (usually caused by the tape recording and reproducing) in accordance with the present invention. The corrected signals are then applied to the data output section 20.

The data output section 20 comprises a rate changer 42 and a data utilization circuit 44. The rate changer 42 acts to return the data to the form and rate of the data at the input to the rate changer 24. The data utilization circuit 44, which may include a monitor, then acts upon the received data in any desired manner.

Figure 4:
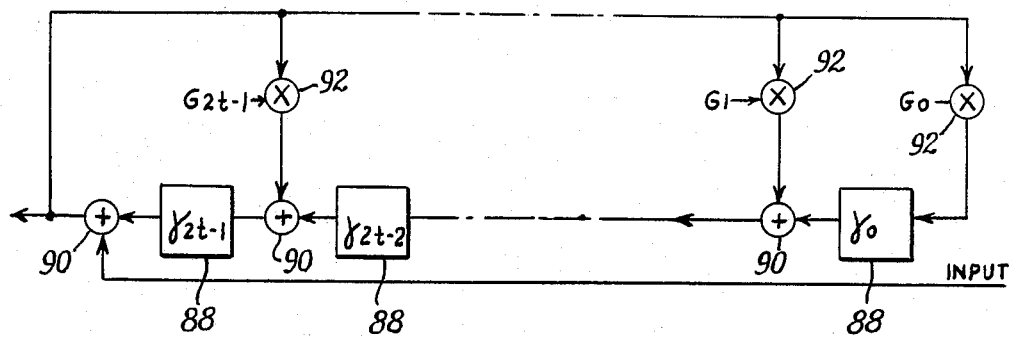
FIG. 4 is a diagrammatic illustration of a circuit for implementing polynomial division in a Galois field useful in encoding or decoding data in the system illustrated in FIG. 1.

The operation of the encoder 14 can be more fully understood by reference to FIG. 4.

The general theory of encoders for cyclic codes is described in Algebraic Coding Theory, pages 119 through 125. The parameters of a cyclic code are (a) the arithmetic field containing the codeword symbols (b) the number, n, of symbols in a codeword (c) the number, K, of symbols in a message block (d) a polynomial, g(x), called the generator polynomial.

The degree of g(x) is $n-K$ and g(x) divides $x^{n}-1$.

A sequence of length n is tested for being a codeword by constructing a polynomial whose coefficients are the terms of the sequence. The first term is the coefficient of $x^{n-1}$:

$$(c_{n-1}, \ldots c_0): C(x) = \sum_{i=0}^{n-1} c_i x \qquad (65)$$

For $(c_{n-1}, \ldots, c_0)$ to be a codeword, $C(x)$ must be divisible by $g(x)$.

There are several ways to produce codewords from messages. The preferred encoder 14 uses the following method. Let the message to be encoded $$(m_1, m_2, \ldots, m_k),$$

form $$M(x) = \sum_{i=1}^{K} m_i x^{n-i} \qquad (66)$$

and use Euclid's division algorithm to find the quotient and remainder when $M(x)$ is divided by $g(x)$.

$$M(x) = Q(x)g(x) + P(x) \qquad (67)$$

where, $$P(x) = p_0 + p_1 x \ldots + p_{n-k-1} x^{n-k-1} \qquad (68)$$

Then $M(x) - P(x)$ is divisible by $g(x)$, and $(m_1, \ldots m_k, -p_{n-k-1}, \ldots -p_0)$ is a codeword. The encoder 14 carries out this division process.

At the decoder 18, the first step is to pass the data through a re-encoder which similarly divides the received word by the generator polynomial. The remainder polynomial is called a syndrome and is a function of the errors only and in the Reed-Solomon case contains all extractable information about the error pattern.

A preferred form of decoder 18 includes error detection and correction circuitry as illustrated in FIG. 2. As there shown, data in on a line 48 are applied to a syndrome generator 50 which operates to derive syndromes which are applied to an error processor 52 controlled by a timing control circuit 54. The error processor 52 derives signals indicating up to two errors per data block and their locations or indicating that there are more than two such errors. The error data are applied to an error correction circuit 56 synchronously with input data that have been appropriately delayed by a delay line 58 so that the errors may be corrected and the corrected data output from a line 60.

More particularly, as illustrated in FIG. 3, the syndromes generated by the syndrome generator 50 are applied to the error processor 52 through an input register 62. The timing control circuit 54 puts a programmer-processor 66 through its programmed cycle. The programmer-processor 66 operates to transfer the incoming syndromes at appropriate times to appropriate places in the error processor circuit 52. Information is stored in and retrieved from internal registers 68. The programmer-processor 66 causes the syndrome data to be called up through a buffer 64 and operated upon by an arithmetic/logic unit (ALU) 70 and transferred to an accumulator (ACC) 72. Such operations include simple addition as well as logarithmic operations by use of a $LOG_{\hat{a}}$ memory PROM (programmable read only memory) 74 and $LOG_{\hat{a}}^{-1}$ memory PROM 76, and the special archyp function by use of an ARCHYP memory PROM 78. Such program and hardware perform the above computations of h, k, $e_{h+k}$, $e_{h-k}$, j and $e_j$ and apply the resulting signals through a buffer 79 to output latches 80 for application to the error correction circuit 56.

The encoder 14 and decoder 18 provide the construction of certain generator polynomials and include a hardware design technique which reduces the amount of arithmetic circuitry by a factor of two relative to designs based on straightforward mechanization of polynomial division.

In the design of Reed-Solomon encoders, once the field is chosen, the primitive element â must be chosen. The choice of â and the construction of the code generator polynomial is as follows:

If n is the cyclic length and t is the number of errors to be corrected, then the degree of g(x) is 2t and is formed as $$g(x) = \prod_{j=j\min}^{j\max} (x - a^j) \quad (69)$$

$$= \sum_{i=0}^{2t} g_i x^i \quad (70)$$

where $$j\min = \frac{n+1}{2} - t \text{ and } j\max = \frac{n-1}{2} + t.$$

The unique choice of jmin and jmax results in $g_0 = g_{2t} = \hat{a}^0$ and $g_{2t-i} = g_i$.

The main operation of a Reed-Solomon encoder is to multiply the output of the top stage of a register by $g_0, g_1, \ldots, g_{2t-1}$ and simultaneously add the resulting products into a shifted version of the register (see FIG. 4). The element â is chosen to be that $n^{th}$ root of unity, which minimizes this circuitry when the elements are represented in the hardware basis.

A detailed description of the mechanization of the division process when the arithmetic field is [0,1] (binary arithmetic) and how it is used in an encoder is given in Algebraic Coding Theory. In particular, see FIG. 5.01 in that reference. This description is easily generalized by viewing each stage of a register as containing a symbol from the field instead of a single bit. Certain lines must include a multiplier as part of the circuit. The general circuit is shown in FIG. 4.

The choice of g(x) for the encoder 14 leads to considerable simplification. First, since $g_{2t} = \hat{a}^0$, no division circuit is necessary. The circuit of FIG. 4 corresponds to that shown in FIG. 1 of Elwyn R. Berlekamp, "Bit-Serial Reed-Solomon Encoder," IEEE Transactions on Information Theory, Vol. IT-28, No. 6, pp. 869–874, November 1982. Since $g_0 = \hat{a}^0$, no multiplication circuit is required for the rightmost stage. Furthermore, since $g_i = g_{2t-i}$, only half of the multipliers need to be constructed and the outputs shared. Also, at the operating speeds of the system, it is possible to timeshare the addition circuits, thus reducing the addition circuits by a factor of two.

Finally, for interleaved codes, each stage of the shift register is replaced with a RAM whose address space equals or exceeds the depth of interleaving. When a given address is selected, then the terms of a given parent code are available for reading and writing.

Further explanation of such encoders and decoders is contained in the reference Bit-Serial Reed-Solomon Encoders, which is hereby incorporated herein by reference. FIG. 4 shows shift registers 88 wired according to g(x). Also lines shown represent 8-bit characters. Each symbol 90 represents an exclusive OR of two 8-bit words, and each symbol 92 represents a constant multiplication in the appropriate Galois field.

The encoder and decoder operations are based on polynomial division. In regular polynomial division, if the divisor does not divide evenly into the dividend, the remainder is non-zero. However, if the remainder is subtracted from the dividend, the result is evenly divisible by the divisor, and the remainder then is zero. The encoder 14 operates in this way. The dividend is a 254th order polynomial, and the divisor is a 12th order polynomial.

The encoder operation is as follows: 243 data bytes are entered into the top 243 positions of the dividend. The remaining 12 low order bytes are filled with zeros. The dividend is divided by the divisor (code generator) polynomial. The remainder is then subtracted from the dividend. The resulting polynomial is a codeword which is evenly divisible by the divisor polynomial. This is the word that is stored in the magnetic tape of the recorder 32.

One important difference in the encoder arithmetic from regular polynomial arithmetic needs to be pointed out. Since the encoder operates in a Galois field, GF (256), instead of the all real numbers field, the arithmetic operations need to be redefined. Addition and subtraction correspond to the same operation, the bitwise exclusive-OR. Multiplication and division are calculated using lookup tables, and implemented in circuitry by exclusive-OR combinations or through memories, all as described in Algebraic Coding Theory and U.S. Pat. No. 4,162,480. The decoder 18 performs similar functions to derive the syndromes.

Figure 5:
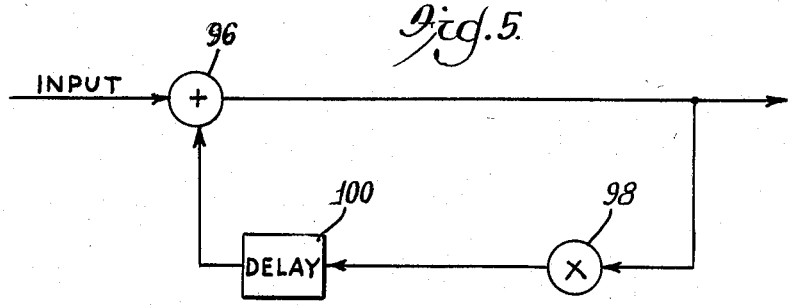
FIG. 5 is a simplified diagrammatic illustration of a circuit implementing polynomial division in a Galois field useful in the decoder of the present invention.

In FIG. 5 is illustrated a simplified polynomial division circuit. In this case, a serial bit input is applied to one input of an exclusive-OR 96, the output of which is applied to the input of a Galois field multiplier 98. The Galois field multiplier 98 multiplies its input by a constant factor â in the Galois field. The output is applied to a delay register 100, which applies its delayed output to the other input of the exclusive-OR 96.

An explanation of the operation of the polynomial division circuit can be made using a simple example where the encoded codeword can be represented by a 3rd order polynomial:

$$Ax^3 + Bx^2 + Cx + D.$$

If such polynomial is divided by a single factor (x+â), the remainder is:

$$D - Câ + Bâ^2 - Aâ^3.$$

As stated above, in the Galois field, addition and subtraction are the same and both may be achieved by an exclusive-OR, such as the exclusive-OR 96. One input is the code word in the form A, B, C, D, entered a bit at a time. Thus, bit A is input and added to 0 at its other input by the exclusive-OR 96, the output of the multiplier being set to zero initially. The sum is multiplied by the constant â by the multiplier 98 to form Aâ. This is delayed in the delay circuit 100, and added to the next bit B by the exclusive-OR 96 to form Aâ+B. This sum is multiplied by â by the multiplier 98 to form Aâ²+Bâ. This is delayed and added to bit C to form Aâ²+Bâ+C, which is multiplied by â to form Aâ³+Bâ²+Câ. This is delayed and added to the next bit D to form Aâ³+Bâ²+Câ+D, which is equivalent to the remainder from the above polynomial division. If this remainder is other than zero, the divisor is not a factor of the dividend. As the dividend is a codeword if properly encoded to make the divisor a factor thereof, any remainder indicates an encoding failure. Hence, the added signal after three multiplications indicates the remainder and, if nonzero, an encoding failure.

In the example considered above for a preferred Reed-Solomon encoder 14, the dividend is a 254th order polynomial, but the principle is the same as for a 3rd order polynomial, except that the multiplication and addition must be performed 254 times. Further, in this example the data are encoded in bytes 8 bits wide. The encoder output is interleaved to a depth of 16. This means that the encoder puts out a byte of one codeword, then a byte of another codeword, etc., for 16 codewords before it puts out the next byte of the original codeword being observed. There are also clock signals each byte and an end of block signal at the end of each codeword for synchronization and timing purposes. These are the given products of the encoder 14 from which, with errors generated in the transmission process, the decoder 18 identifies and corrects errors.

The Galois multiplier may be comprised of a 256×8 PROM (or two 256×4 PROMs) programmed in a conventional manner according to known principles of Galois multiplication. Such multiplication of a register by a wired constant is explained in some detail in Algebraic Coding Theory, particularly at pages 44–47, which pages are hereby incorporated herein by reference. See, also, U.S. Pat. No. 4,162,480. Such explanations will enable those skilled in the art to program the PROM to multiply the respective sums by the particular constant â corresponding to a factor of the generator polynomial.

While the multiplication may be implemented by appropriate exclusive-OR gates for summing, in the embodiment discussed below, the implementation is by PROMs. As there are but 255 possible input bytes (not counting null), there are but 255 possible products of any input by any Galois field number for which the PROM is programmed. By using a 255×8 PROM, the 8-bit inputs can address any of the 255 products. The PROM can therefore be programmed by entering the known products as a look-up table addressed by the 8-bit byte inputs.

In FIGS. 6 to 9, 13 and 14 is illustrated a specific embodiment of a decoder as shown generally in FIG. 2 with an error detection and correction system actually constructed utilizing the present invention.

Figure 6:
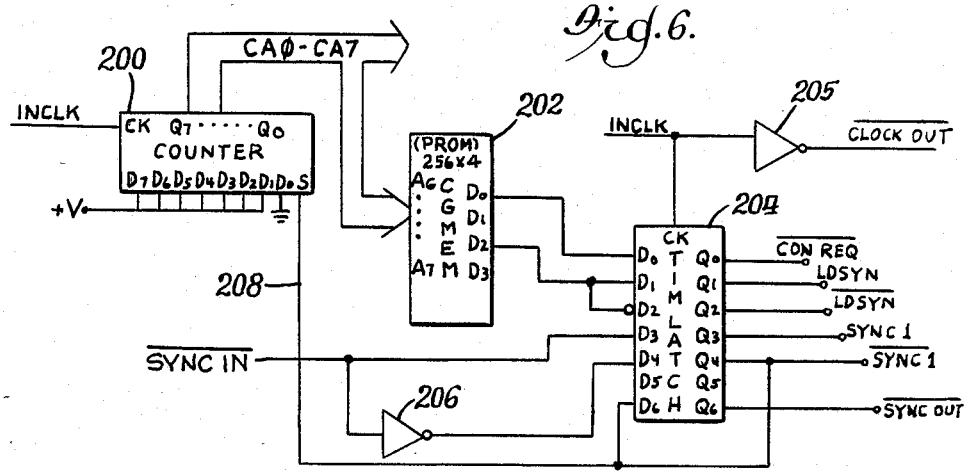
FIG. 6 is a circuit diagram of a timing control circuit for the decoder shown in FIG. 2.

In FIG. 6 there is shown in greater detail the circuitry providing the timing control function performed by the timing control circuit 54 shown in FIG. 2. The timing control receives the 14.6 MHz input clock INCLK from the data transmission system 16 and further, every 255 bytes, accepts an end of block signal SYNC* (an asterisk indicating the negation of the indicated signal). These two signals are converted into a number of clock signals which are distributed to various parts of the decoder system in order to provide synchronism between the data movement and the various error correction and processing functions.

A counter 200 serves as a major synchronizer for the system. The counter 200 outputs 8-bit addresses CA0–CA7 which indicate the particular coefficient in the received polynomial R(x) which is being addressed. The output of these addresses come from the outputs Q0–Q7 of the counter 200 and change at the rate of the input clock INCLK received at the terminal CK of the counter. Every SYNC* pulse via line 208 presets the counter by reading in the inputs D1–D7. This produces a 254 to zero count for every SYNC* pulse.

The addresses CA0–CA7 generated by the counter 200 are used in one instance to address the inputs A0–A7 of a clock generator memory 202. The clock generator memory (CGMEM) 202 is a 256×4 PROM which produces different outputs on data lines D0–D3 depending upon the address input. The PROM listing is as set forth in FIG. 18Q in hexadecimal. The particular address generated by the counter 200 will control clock signals generated from these lines to the inputs D0–D6 of a timer latch 204. The timer latch 204 is clocked synchronously by the input clock INCLK to receive the control signals from CGMEM 202 and produces the output timing signals required by the system. By varying the bit patterns in CGMEM 202, the following timing signals, synchronous to the addresses CA0–CA7, are generated. The signal CONREQ* is used as a conversion request by the error processor 52 and is output from the Q0 terminal of timer latch 204. This signal is generated by the CGMEM 202 from the D0 output line. From the D2 output line of the CGMEM 202 and its inversion, the timer latch 204 generates the synchronization signal LDSYN and its inversion from the outputs Q1 and Q2 respectively. These control signals will cause the error processor 52 to load the four coefficients of a syndrome at the correct times from a fourth order syndrome generator 120. In a similar manner, the pulse SYNC is loaded with its inversion by inverter gate 206 into the D3 and D4 inputs of the timer latch 204 to become the control signals SYNC* and its inversion. These two signals are used to load the syndrome $S_{130}$ from the first order syndrome generator 102 into the error processor and to synchronize the delay line 58 and the error correction circuit 56.

The inversion of the SYNC* signal is fed back to the D6 input of the timer latch 204 to become the SYNC*-OUT signal one clock delay later. This signal is used as a buffered version of the SYNC* signal such that it may be passed on to any further circuitry that uses the decoder output, such as the rate changer 42. In addition the inversion of SYNC is used as the reset pulse for the counter 200 by its connection to the S input of that device via a line 208. An inverter 205 buffers the input clock INCLK and generates an output clock CLKOUT which may be used to communicate with devices using the decoder output.

Figure 7:
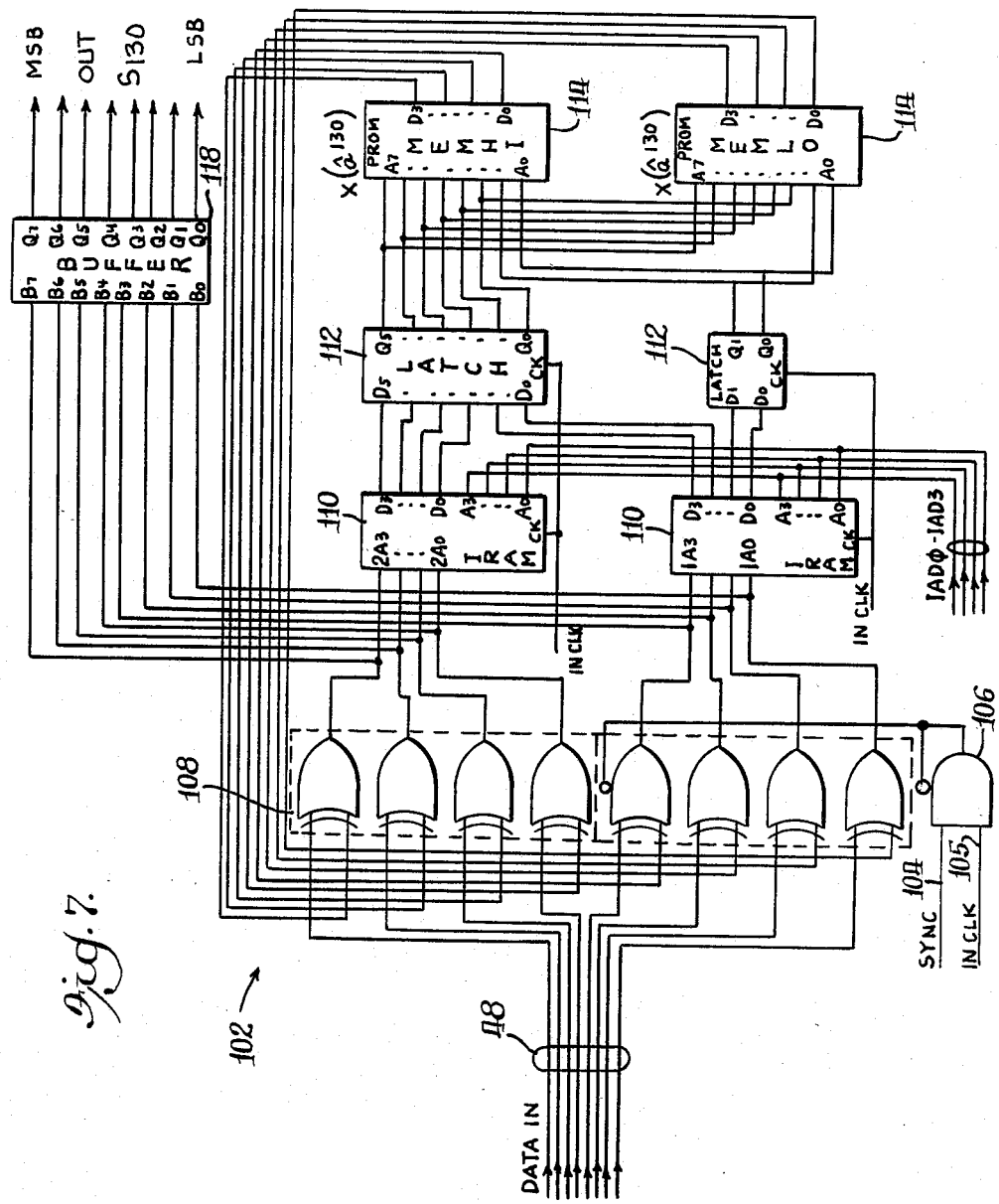
FIG. 7 is a circuit diagram of a first order syndrome generator for the decoder shown in FIG. 2.

As shown in FIG. 7, the syndrome generator 50 includes a first order syndrome generator 102 for generating the syndrome $S_{130}$. The syndrome generator 102 expects a positive end of block SYNC pulse on a separate line corresponding to the last byte of every codeword in the interleaved output. Such signals are conventionally and necessarily available for reasons of rate changing and insertion of synchronization. This check bit is used to inform the circuit when a received data block has ended.

In the illustrated embodiment, the end of block SYNC pulses are applied as SYNC on a line 104 with clock signals INCLK on a line 105 to an AND gate 106 to reset the syndrome generator to 0. The data in bytes are applied from line 48 to exclusive-ORs 108, the outputs of which are applied through 16-bit shift registers 110 to latches 112 where the signals are latched upon the next clock pulse.

Figures 18A, 18B, 18C, 18D, 18E, 18F:
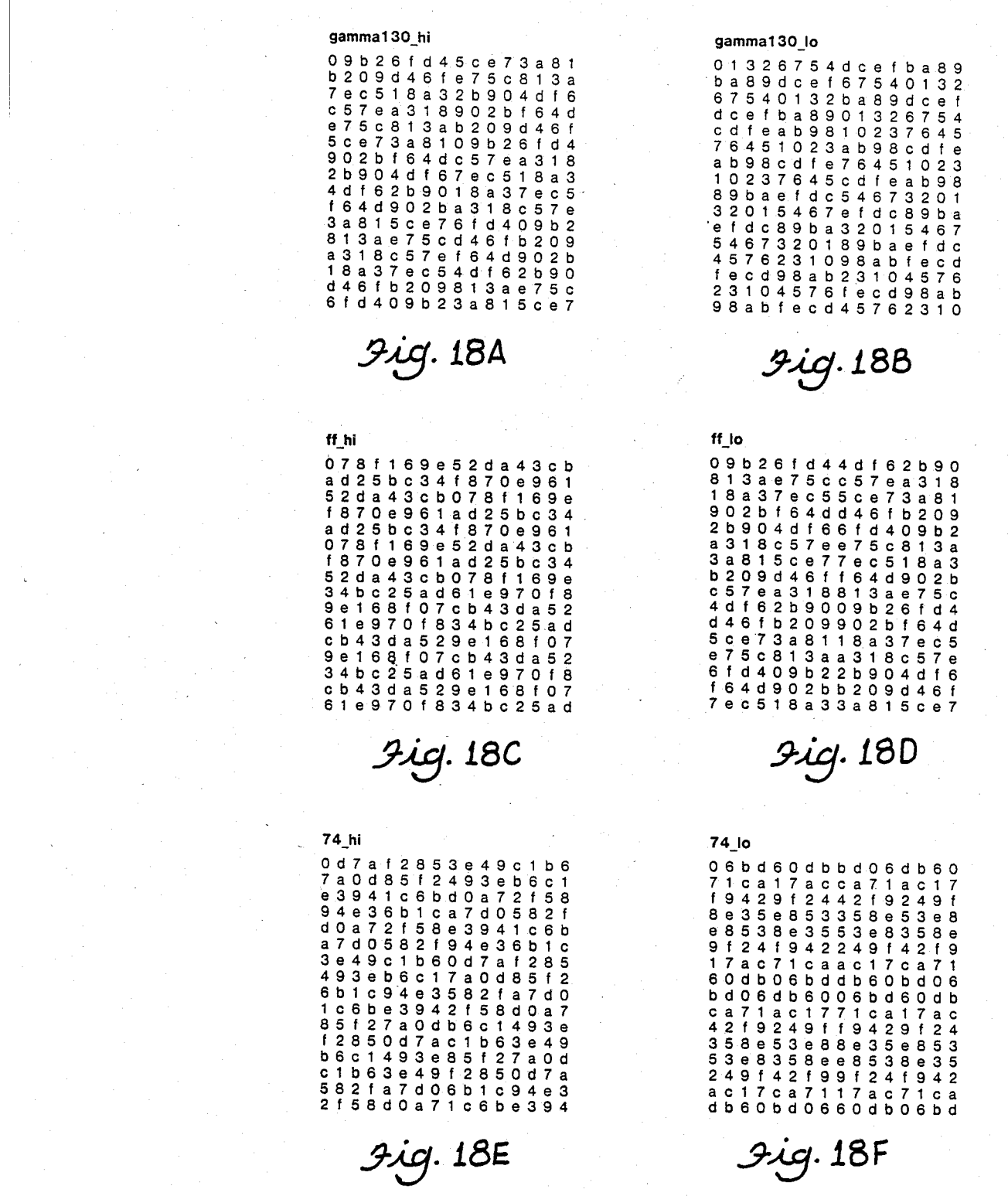

The outputs of the latches 112 are applied to a Galois field multiplier 114, in the form of a PROM 114 programmed as shown in FIGS. 18A and 18B to multiply by a particular number $â^{130}$ in the Galois field. The product of such multiplication is in the form of an 8-bit byte and is applied to the exclusive-ORs 108. The shift registers 110 may be comprised of a pair of 16×4 RAMs addressed by a counter 116 (FIG. 14) which may be comprised of a 4-bit universal binary counter to generate interleave addresses IAD0–IAD3. The counter 116 successively addresses 16 bytes of 8 bits in the shift registers 110. The information previously entered at each memory location is read out on the 8 output lines, and then latched into the latches 112 and applied to the Galois field multiplier 114 from the respective addresses of the registers 110. In this way, the addresses are incremented in a 16 address cycle upon each clock bit. This sorts out the respective interleaved codewords and outputs the product needed for the current addition by the exclusive-ORs 108. The division thus proceeds as in the circuit of FIG. 5 until an end of block bit occurs for a particular received data block. The sums are applied through buffers 118 and latched into input latches 62 (FIG. 13) with the clock pulse following an end of block bit, and the syndrome generator is reset to zero for the next syndrome generation.

The generation of the syndromes $S^{126}$, $S^{127}$, $S^{128}$ and $S^{129}$ may be performed by similar circuitry. However, a circuit actually built and tested was that illustrated at 120 in FIG. 8 wherein a 4th order syndrome generator was used to divide by the 4th order polynomial $(x+â^{126})(x+â^{127})(x+â^{128})(x+â^{129})$ to form a 4th order syndrome $$s(x) = s_3 x^3 + s_2 x^2 + s_1 x + s_0 \tag{71}$$

To provide the first order syndromes for determining errors and their location in accordance with the above, the fourth order syndrome must be converted into four first order syndromes.

Figure 8:
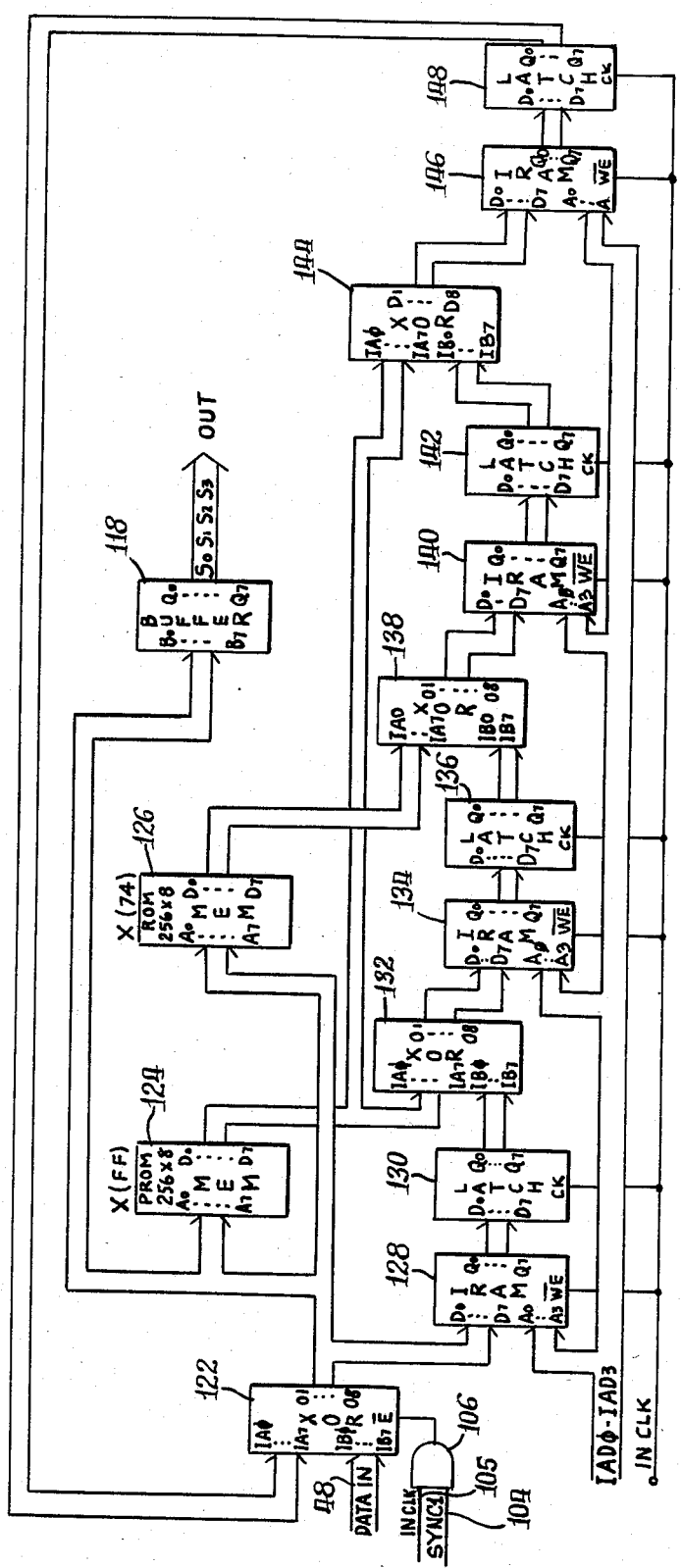
FIG. 8 is a circuit diagram of a fourth order syndrome generator for the decoder shown in FIG. 2.

The four factors chosen are those forming a symmetrical fourth order polynomial in the form $$â^0 x^4 + â^{168} x^3 + â^{47} x^2 + â^{168} x + â^0$$

where the coefficients have been reduced in the Galois field. In the particular Galois field implemented and with the particular four factors implemented, $â^{168}$ corresponds to ff and $â^{47}$ to 74 in 8-bit hexadecimal, $â^0$, unity, being de. The circuit of the syndrome generator 120 as shown in FIG. 8 operates much like the first order syndrome generator 102 of FIG. 7, except that multiplication is by the above coefficients ff and 74.

Data are applied in bytes on the line 48 to exclusive-ORs 122, corresponding to exclusive-ORs 108 of the syndrome generator 102. The outputs are multiplied by respective multipliers 124, 126. Because the polynomial is symmetrical, the factor ff appears twice, and the same multiplier 124 may be used for both. The outputs of the exclusive-ORs 122 are applied directly to shift registers 128 (corresponding to multiplying by $â^0$, the coefficient of the last term of the polynomial) and upon shifting to account for the interleaving, are applied to latches 130. The Galois field products from the multiplier 124 (in the form of a PROM programmed as shown in FIGS. 18C and 18D corresponding to multiplying by ff, the coefficient of the fourth term of the polynomial) are summed by exclusive-ORs 132 with the corresponding outputs of the latches 130, delayed one byte or term of the respective input data block, and their sums applied through shift registers 134 to latches 136. The Galois field products from the multiplier 126 (in the form of a PROM programmed as shown in FIGS. 18E and 18F corresponding to multiplying by 74, the coefficient of the third term of the polynomial) are summed by exclusive-ORs 138 with the corresponding outputs of the latches 136, delayed another byte, and their sums applied through shift registers 140 to latches 142. The Galois field products from the multiplier 124 (also corresponding to multiplying by ff, the coefficient of the second term of the polynomial) are summed by exclusive-ORs 144 with the corresponding outputs of the latches 142, delayed another byte, and their sums applied through shift registers 146 to latches 148. The outputs of the latches 148, delayed another byte, are fed back to the exclusive-ORs 122 for summing with the data in.

The multiplying circuits 124 and 126 operate like the multiplying circuit 114 of the syndrome generator 102. Similarly the shift registers 128, 134, 140 and 146 operate much like the shift registers 110 under the control of the interleave address signals JAD0–IAD3 to account for interleaving, and the latches 130, 136, 142 and 148 act like the latches 112. The exclusive-ORs 122, 132, 138 and 144 act like the exclusive-ORs 108.

The result of this operation is division by the polynomial to leave a remainder in the form $s_3 x^3 + s_2 x^2 + s_1 x + s_o$ where signals corresponding to the respective coefficients appear successively at the outputs of the exclusive-ORs 122 at the times the respective last four terms of a received data block are received as data in. These four signals correspond to the terms of the fourth order syndrome s(x) of Equation (71) and are applied through the buffers 118 to the latches 62 of the error processor 52 which operates under the control of the programmer-processor 66, as will be described below, according to the following equations to derive the respective four first order syndromes.

$$S_{126} = s_3(\hat{a}^{126})^3 + s_2(\hat{a}^{126})^2 + s_1(\hat{a}^{126}) + s_0 \tag{72}$$

$$S_{127} = s_3(\hat{a}^{127})^3 + s_2(\hat{a}^{127})^2 + s_1(\hat{a}^{127}) + s_0 \tag{73}$$

$$S_{128} = s_3(\hat{a}^{128})^3 + s_2(\hat{a}^{128})^2 + s_1(\hat{a}^{128}) + s_0 \tag{74}$$

$$S_{129} = s_3(\hat{a}^{129})^3 + s_2(\hat{a}^{129})^2 + s_1(\hat{a}^{129}) + s_0 \tag{75}$$

In FIG. 3 there is illustrated the system block diagram of the error processor 52. The error processor 52 comprises a programmer-processor 66 and associated circuit elements which by processing the coefficients $s_3$, $s_2$, $s_1$, $s_0$ and the syndrome $S_{130}$ produces an error solution for received data blocks R(x) having one or two errors. The output of the error processor 52 is either one location j or two locations (h+k, h−k) with one error solution $e_j$ or two error solutions $e_{h+k}$, $e_{h-k}$. The programmer-processor 66 begins one error correcting cycle by receiving the input signal CONREQ* indicating that a conversion request is desired because an incoming data block R(x) should be checked for errors and ends the cycle when the error solutions and locations have been calculated.

The processor 66 is programmed to solve the above Equations (64), (62), (56), (37), (44) and (51) relating $e_j$, j, $e_{h+k}$, h+k, $e_{h-k}$ and h−k as functions of $S_{126}$, $S_{127}$, $S_{128}$ and $S_{129}$ and checking the results as a function of $S_{130}$. The processor 66 completes this task in real time so that no matter how many received data blocks R(x) have errors, they will all be corrected, provided that no more than two errors per received data block exist. The processor 66 will additionally flag those data blocks R(x) which have more than two errors and provide an indication of the number of errors corrected. The processor 66 cannot be outrun by the data stream because it does not store the data stream longer than one data block delay and it thus will never become saturated such that it causes the recording and reproducing system to lose data.

The processor 66 controls the input of the coefficients and syndromes via input registers 62 to the B input of the arithmetic/logic unit (ALU) 70. The input enters the B input of the ALU 70 on a B-bus either through the buffer 64 or the LOG$_{\hat{a}}$ PROM 74 which takes the logarithm of its input. The processor 66 by means of a plurality of control lines determines through which device the input enters the ALU 70.

Additionally, once the inputs are presented to the ALU 70 they can be operated on by the ALU with other data via an input A. The result of an ALU operation is output to the accumulator 72. The accumulator output can be transmitted via an A-bus to the A input of the ALU, stored in one of sixteen bidirectional internal registers 68, or stored in one of four output registers 80. The output of the registers 68 are connected to the B-bus. The output of the accumulator 72 may be functionally translated by LOG$_{\hat{a}}^{-1}$ read only memory 76 or ARCHYP read only memory 78 into a different value before it is stored at any one of the three destination locations. Which location and whether a function translation takes places depends upon signals on the control lines from the processor 66. The PROM 76 performs an antilog translation of the output of the accumulator and the PROM 78 performs a ARCHYP function translation of the output of the accumulator 72. The functional translation ARCHYP will be more fully explained hereinafter and relates to the translation of the values of a function $(\hat{a}^k + \hat{a}^{-k})$ into corresponding values of the offset parameter k.

The speed of the error processor 52 is enhanced by this structure because of the ease with which data can be manipulated. Data in the input or internal registers 62, 68 can be loaded directly into the accumulator 72 through ALU input B. Alternatively, the data at input B may be operated on by the ALU arithmetically with other data from input A or with internal ALU logic functions. The data input on the B-bus can either be operated on unchanged, if input through the buffer 64, or translated into a logarithm by the PROM 74. Similarly, the output bus structure (A-bus) provides a data path from the output of the accumulator to either the A-input of the ALU, the internal registers 68, or the output registers 80. The data may be transferred unchanged, if transferred through the buffer 79, or translated into an antilog or ARCHYP function by PROMs 76, 78 respectively. One part of the structure which increases processing speed even more is the unclocked function generators of the system. The only devices clocked are the registers (input, internal, and output) and the accumulator. Thus, manipulation of the data occurs by transferring data from a source to a destination through a device that provides the operation desired. The specialized unclocked functions are provided by the three PROMs 74, 76 and 78 and further include the arithmetic and logical functions of the ALU 70. This produces the advantage that all manipulations of data for the operations defined take place in a single clock cycle along with a simultaneous data transfer.

This structure provides a very powerful and simple processor for executing Galois field and modulo 255 arithmetic for the particular field chosen. Because of the capability of internally storing a partial term in the internal registers R0-R15 shown as device 68, complex calculations may be simplified by factoring them into smaller parts. Additionally the dual bus structure which allows a logarithm to be taken on one of the inputs of the ALU and an antilog to be taken on the output of the accumulator produces a machine which can multiply, divide and take powers by simple addition. Moreover, the specialized ARCHYP function generator provides in a single instruction a difficult calculation in one processor cycle with the look up table. This function is particularly useful in the error solution for two or fewer errors in the Galois field used herein.

All of these reasons combine to produce a processor structure which is extremely fast and facile in calculating the locations and values of two errors in a received data block R(x) input to the decoder. The speed of the processor is necessary to allow the error correction to take place in one data block before the start of the next codeword 255 clock cycles later. Without the speed of this specialized processor the errors could not be corrected in real time and would require memory to store more than one data block. Depending upon the error rate and the interleaving structure a decoder memory could be saturated by the error rate and lose its error correcting capability. However, with real time processing as the invention provides, if a received data block R(x) has two or fewer errors, then every error will be corrected. Further for those received words having more than two errors error flags will be provided without any additional loss of data.

The processor 66 is shown in more detail in FIG. 9 where a control memory 220 is illustrated. The control memory 220 is a 256×16 read only memory which stores the control program of the processor. Each instruction of the control program is fetched from the control memory 220 by an 8 bit address input to its address terminals A0–A7. This address is generated by a program counter 238 from its output terminals Q0–Q7. The control memory 220 produces 16 bit control words from the memory locations addressed by the program counter to sequentially step through a program which controls operations of the decoder. The control words are output from the memory output lines D0–D15 to similarly labeled inputs of a control latch 222. The control latch 222 outputs the control bits of each memory word from output lines Q0–Q15 as groups of control signals which regulate the data flow and operation of the elements shown for the error processor 52. Each control word is executed by performing the functions commanded prior to entering the next cycle by fetching a subsequent instruction.

The assignment of the control lines is illustrated in FIG. 10 which is a table showing the control line operations corresponding to the control bits assigned by function. Specifically, the processor 66 can execute two types of instructions. One type of instruction occurs when an ALU operation is to take place. This produces a function which requires two operands and a result to be placed in the accumulator 72. The second type of operation that the processor can execute is a branch operation where an affirmative test for a particular set of conditions will cause the program counter 238 to stop its sequential advance and jump to a predetermined address in the control memory.

Figure 13:
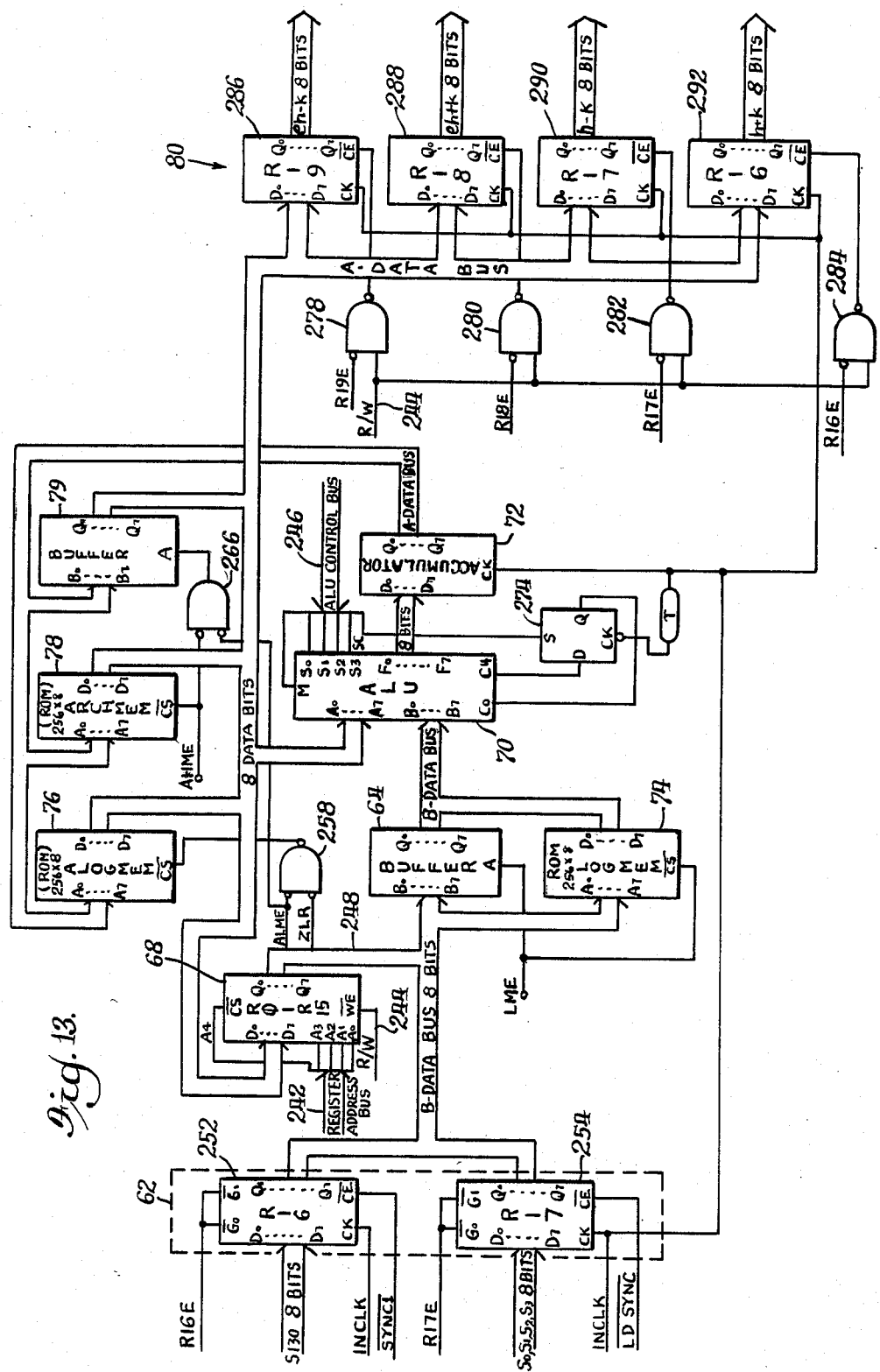
FIG. 13 is a more detailed circuit diagram of the error processor shown in FIG. 2, except for the programmer-processor.

With respect now to the ALU operations and specifically with reference to FIGS. 9 and 10, it is seen that control lines Q0–Q3, and Q12 of latch 222 are labeled A0–A4 and define a register address bus 242. The register address bus 242, depending upon the bit selection of the memory word, acts to select one of the internal registers R0–R15. Additionally, the register address bus 242 acts through multiplexer 224 and inverter 240 to select the input registers R16 and R17 or the output registers R16–R19 (FIG. 13). The multiplexer 224 is connected to address lines A0–A2 which enable one out of the eight output lines Q0–Q7 of the device depending upon the decoding of inputs A, B, and C. The input and output registers are selected by a high level on the control line labeled A4, which is inverted in an inverter 240 to enable the multiplexer chip 224. To differentiate between the input and output registers and which operation is to be performed for the internal registers, a READ/WRITE control line 244 is provided. Data are stored in the internal registers when they are addressed, and a WRITE state is applied to line 244, and conversely, data are read from the internal registers when enabled and a READ state is present on line 244. It is the combination of the R16E or R17E signal and READ state on line 244 which enables the input registers and the combination of R16E–R19E and the WRITE state on line 244 which enables the output registers.

Additionally two nonregister devices can be selected in this manner by control lines labeled R22E, R23E. The register R22 enable, R22E, is used in the program to provide an indication of the number of errors found per codeword. It is set every time that a error solution output is made by the error processor circuitry. The register R23 enable, R23E, is used to provide an indication of an invalid solution for the offset variable k or a solution to the error equations which indicates more than two errors have been encountered per codeword. The signals R22E and R23E are selected in the same manner as an input or output register would be, that is, by addressing that register location so that the corresponding enable line is strobed.

The outputs Q10, Q11 of the control latch 222 define the control lines $f_1$ and $f_0$ which are input to the A and B terminals of a multiplexer 226. The multiplexer 226 decodes the two bits $f_0$, $f_1$ and produces a one out of four enabling signal on lines Q1–Q3. The decoding table for the bits $f_0$, $f_1$ are shown in FIG. 11 which is a table indicating that the output Q1 is used to enable the $LOG_{\hat{a}}$ memory 74 with a signal LME. The output Q2 is used to enable the $LOG, _{\hat{a}}{}^{-1}$ antilog memory 76 with signal ALME, and the combination of the bits $f_0$ and $f_1$ are used to enable the ARCHYP memory 78 with signal AHME.

Combinations of these output select lines from the register address bus 242, register multiplexer 224, read/write line 244, and memory multiplexer 226 define the direction and paths for the data throughout the system. By enabling the different types of devices in the correct order, the facile data flow as mentioned previously can be effected with great advantage.

The additional information needed to perform the processing of the coefficients and syndromes into error locations and values of the errors is the arithmetic and logical operations which are performed on the data while passing through the ALU. These functional operations are defined by the output control lines Q4–Q8 and Q14 which translate into control signals $s_3$–$s_0$, M and SC output on ALU control bus 246. FIG. 12 is a table of the instruction set for the particular bit patterns from the control latch 222 and indicates in this machine that addition, subtraction, incrementation and loading the accumulator from either the A or B inputs are, with 0, or with 255, the substance of the operations defined. The modulo 255 addition is used for address calculation and the exclusive-OR function is used for Galois field addition. It is noted that all of the operations can be performed in one clock cycle. It is evident that the instruction set may be rapidly executed in real time and does not include a time consuming multiply or divide instruction which would slow down the processing of the machine.

The branch or jump operation will now be more fully explained with respect to FIG. 9. The alternate operation of the machine instead of data transfer to and from the registers, the ALU operations, is jumping to a different address in the program depending upon conditional selection. Control lines Q13 and Q15 generating the signals CZ and BEQ provide this function to the operational instruction set of the processor.

The signal CZ or check 0 is executed in an ALU operation to determine whether the output of an internal register on the B-data bus 248 is zero. If the check 0 signal CZ is low and all bits on the B-data bus 248 are additionally low, then a high level state from the output of an AND gate 228 sets a latch 230. The setting of the device is caused by clocking that high level input into the Q0 output of the device. This operation provides a conditional test which, depending upon whether the data output from the particular register is zero or not, will either set or not set the Q0 output of the latch 230. Thereafter, during the next clock cycle, the processor 66 may execute a branch instruction by bringing the bit BEQ high to enable an AND gate 232. When the signal BEQ goes high the other control bits of the particular control word comprise an 8 bit address $a_0$–$a_7$ at the Q0–Q7 outputs of the control latch 222. This branch address is fed to the B0–B7 inputs of a buffer 236 and through the buffer to the inputs of the program counter 238. This address when loaded into the program counter 238 becomes the point in the program to which control is transferred. The BEQ bit being set high will cause a low level output from the AND gate 232 which passes through a NOR gate 234 to the set input S of the program counter 238. This signal will load the branch address from the buffer into the outputs of the program counter 238 causing a transfer of control to that address in memory.

This operation provides a convenient transfer of control during the program sequence to produce different routines based upon conditional branches and tests for conditions. The branch operation takes two cycles to complete, one for the test and the second for the transfer of control and loading of the program counter with the new memory location. However, because the test is done in an ALU instruction, other ALU functions may be executed simultaneously with the test as long as the data on the B-bus is zero when the transfer is desired. The operation of the program counter continues after the branch in a manner similar to that of normal operation by sequentially incrementing the program counter at each clock cycle.

The only other control signal which alters sequencing of the program counter 238 is the conversion request signal CONREQ*. This signal is input on a line 250 to one of the terminals of the NOR gate 234 and resets the program counter according to the outputs of the buffer 236. The conversion request signal CONREQ* further is received at the enable input A of the buffer 236 to cause the signals presented at the Q0–Q7 outputs of the buffer to be all zeros. The conversion request signal CONREQ* is true when low and produces this disabling signal to the buffer 236 to produce all zeros on the outputs thereof while loading the program counter 238 from these outputs. When the conversion request line 250 goes low the signal passes through the NOR gate 234 to input S of the program counter 238 and resets the program counter to zero, which is used as the starting address of the program.

In summary, the processor steps through the control program in the control memory 220 in a fetch-execute cycle according to a sequential incrementation of the program counter 238 unless a conversion request signal or a branch instruction is encountered. Upon encountering a conversion request signal, the program counter is set to the start of the control memory, address 00, and thereafter continues to sequentially increment from that point. Upon encountering a branch instruction, the program counter is loaded with the branch address via the buffer 236 and thereafter continues to sequentially increment from that new address.

The detailed circuitry comprising the error processor 52, other than the processor 66, is more fully detailed in FIG. 13. The input registers are implemented as two synchronous latches 252 and 254. Each latch has a pair of enable inputs G0 and G1, a clock input CK, and a chip enable input CE. Data are entered into each latch through inputs D0–D7 and latched into the outputs Q0–Q7. The input register R16 or latch 252 is clocked by the input clock INCLK and loaded by the timing signal SYNC*. The outputs Q0–Q7 place the data latched in the device onto the B-data bus when enabled by the signal R16E. Operationally, the syndrome $S_{130}$ is clocked into the latch 252 upon the next clock after SYNC* enables the chip. The data remain in the latch until they are needed by the processor 66, at which time the latch 252 is addressed by the register enable signal R16E to place the data on the B-data bus.

The B-data bus is an 8-bit bus structure which provides a data path for inputs from the register R16 to either the B0–B7 inputs of the buffer 64 or the A0–A7 inputs of LOG$_â$ memory PROM 74. The outputs of the buffer Q0–Q7 are a continuation of the B-data bus as are the outputs D0–D7 of the PROM 74. The B-data bus terminates at the inputs A0–A7 of the ALU 70. The buffer 64 and the PROM 74 are alternately enabled by the log memory enable signal LME. The LME signal is received at the A input of the buffer 64 and the CS* input of the PROM 74 to provide alternative data paths for received data on the B-data bus. The PROM 74 performs a translation of input data into a logarithm to base â of that data via a memory table. The memory table is illustrated in FIGS. 18K and 18L and provides the conversion from a Galois field element into the logarithm of that element. The operation is defined as a normal logarithm would be to the base â. That is the LOG$_â$ of any element in the Galois field is the power by which â must be raised to equal that element. The power value is computed in binary code, modulo 255.

Further, an input to the B-data bus is the output of the input register R17 or input latch 254. As was the case with the input register R16, the register R17 receives data into the latch 254 upon the pulsing of input clock INCLK connected to its CK input. These data are input when the chip is enabled by the signal LDSYNC* which is generated by the timing and control circuitry 54. The data in the latch 254 are read onto the B-data bus by enabling its output Q0–Q7 via the signal R17E. In this manner the coefficients $s_3$, $s_2$, $s_1$ and $s_0$ are clocked into the input register R17 by the LDSYNC* signal and taken from the register by the processor when needed for calculations in the control program.

The third outputs to the B-data bus are the outputs Q0–Q7 of the internal registers R0–R15 (68) which form bidirectional registers for holding partial calculations and data. Data are written into the registers R0–R15 through the A-data bus via their input terminals D0–D7. The registers comprise 16 eight bit words of RAM which can be addressed by the register address bus 242 via address lines A0–A3. The address line A4 is used to select the internal registers with a low signal via the CS* input of the device. Data can be loaded into a particular address or register set on the register address bus 242 by loading the data on the A-data bus and producing a write state on line 244. Alternately, data are read from the registers 68 during the read state on line 244 from the memory location addressed on the register address bus 242.

Therefore, there can be three inputs to the B-data bus, one from the output of the internal registers 68 or one from either of the input registers 252, 254. These inputs can enter the B channel of the ALU either unmodified or as a logarithm via the buffer 64 and the LOG$_â$ memory 74.

The ALU 70 is an asynchronous device having two channel inputs A0–A7 and B0–B7. Each of the channels A, B may be provided as an operand for manipulation. The ALU 70 operates on particular input data bytes according to the bit pattern it decodes from input lines $s_0$–$s_3$ and M on the ALU control bus 246. The table for each functional bit combination is more fully illustrated in FIG. 12. Further, carry and incrementation functions for the ALU 70 can be provided by a latch 274 which receives a carry out bit from output C4 and clocks it into its Q output during the next clock cycle. This output is fed back to a carry in input CO to provide the functions. Further the carry in bit may be set by the processor 66 via the control line SC which connects to the S input of the latch 274.

The results of the ALU operations are always clocked into a latch termed the accumulator 72. This device is a clocked latch which receives the data operated on by the ALU at its input terminals D0–D7 and, at the clock, produces a latched output on data lines Q0–Q7 which are connected to the A-data bus.

The data that are transferred onto the A-data bus from the accumulator 72 can be transferred to either one of the memory devices 76 and 78 or the buffer 79. The memory 76 is a read only memory device having an area of 256 eight bit words which are addressed from the A-data bus via inputs A0–A7. The outputs of the memory device 76 are D0–D7 and provide a translation of the data into the antilog of the input. The Galois antilog of a number n is defined in the Galois field similarly to that of a common antilog. The Galois antilog is the Galois field element that is yielded when $â$ is raised to the respective power n. The power value input is in 8-bit binary code, modulo 255. The values of the function are stored in the memory in accordance with the PROM listing shown in FIGS. 18M and 18N.

The antilog memory 76 produces its output to the A-data bus upon enablement of the memory by the output signal of an AND gate 258. The signals that are combined to generate this enabling signal are the low level of the analog memory enable signal, ALME, and the zero log return signal ZLR. The ZLR signal which disables the memory 76 is from the processor branch enable test when data on the B-data bus are determined to be zero. When taking an antilog with memory 78 this test is set such that if the logarithm of a particular number is zero then taking the antilogarithm of that result will also produce a zero.

The PROM 78 provides the archyp functional translation for data on the A-data bus input to its terminals A0–A7 via its output lines D0–D7. The read only memory 78 is 256 bytes in length and is enabled via a low level signal on its CS input. A low enabling signal is provided by the signal line AHME from the processor 66 (FIG. 9) to select this memory. The functional translation is to provide values of the offset k in 8-bit binary code from Galois field values of the function $â^k + â^{-k}$. The values of the function are stored in the memory according to the PROM listing in FIGS. 18O and 18P.

The buffer 79 is a common byte buffer having inputs B0–B7 and outputs Q0–Q7. The buffer provides a break in the A-data bus where data put on the bus by the accumulator 72 can be blocked from passage to the other side upon its disablement. The enabling or disabling of the buffer is provided by an AND gate 266 which is enabled by the negation of the signal AHME and the signal ALME. The buffer 79 is thus enabled when neither the antilog memory 76 nor the archyp memory 78 is enabled.

The output registers R16–R19 are shown as latches 80 similar in construction to the latches 254 and 252 illustrated as the input registers. A latch 286 is clocked by the input clock INCLK and enabled by the output of an AND gate 278. A latch 288 is similarly clocked by the input clock INCLK and enabled by the output of an AND gate 280. Identically, latches 290 and 292 forming registers R17 and R16, respectively, are clocked by the input clock INCLK and enabled by AND gates 282 and 284 respectively. One of the enabling inputs to the AND gates 278, 280, 282 and 284 is the read/write signal from the processor control line 244. Upon being enabled with the write state of this signal, each of the gates can be singularly enabled by a true input from the respective enable signal. Thus, if the program in the processor desires to write into register R16, the signal R16E is brought to a true state and the write state of the signal on line 244 generated. Similar operations allow data on the A-data bus to be entered into the other output registers R17–R19.

During operation of the program, register R16 is loaded with the error location j or h+k, register R17 is loaded with the error location h−k, register R18 is loaded with the error solution $e_j$ or $e_{h+k}$, and register R19 is loaded with the error solution $e_{h-k}$. The outputs of the latches 286, 288, 290, and 292 transfer these values to the error correction circuit 56 for insertion in the delayed data word.

Figure 14:
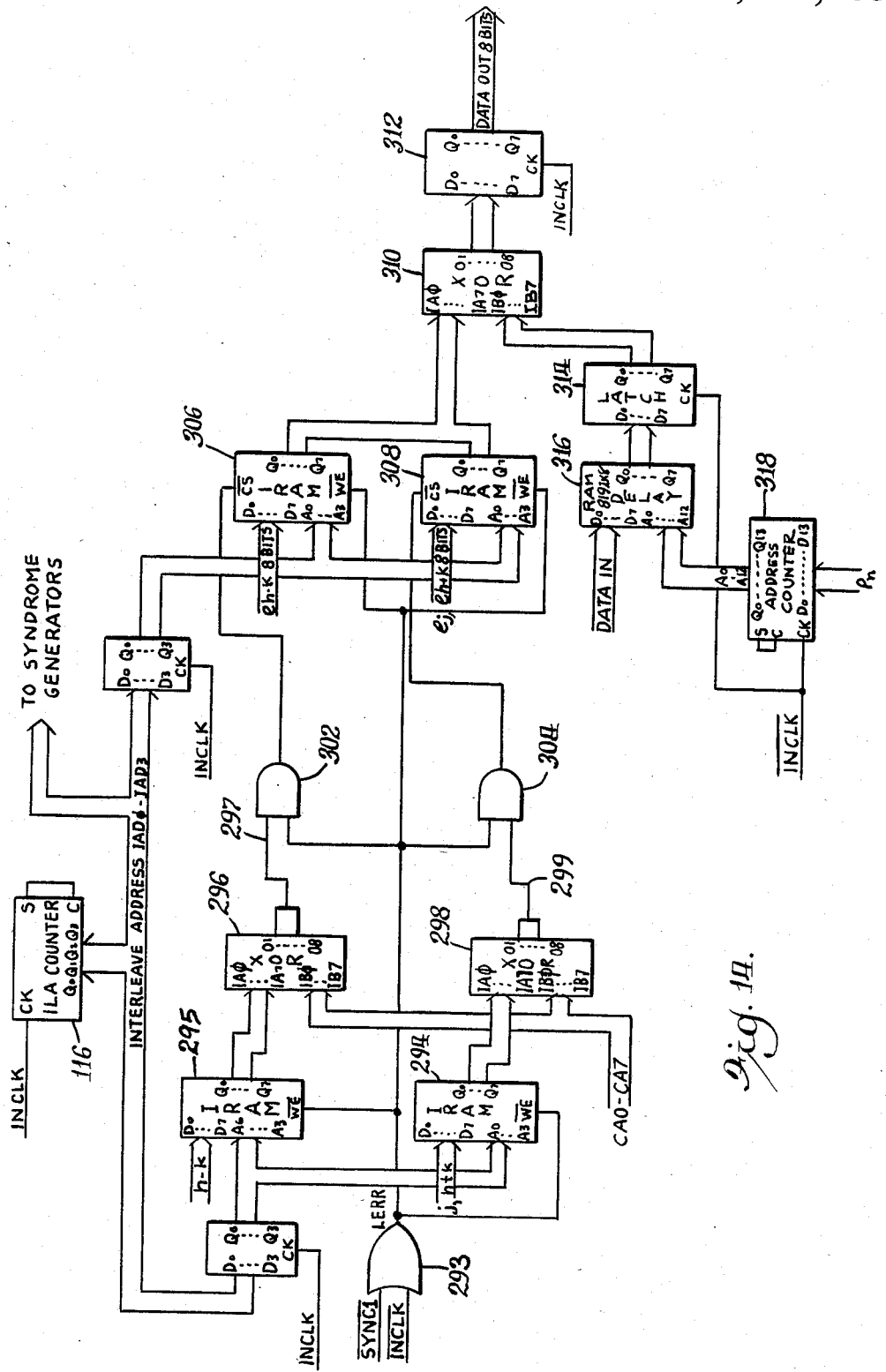
FIG. 14 is a circuit diagram of an error correction circuit and a delay circuit for the decoder shown in FIG. 2.

FIG. 14 illustrates the error correction circuit 56 which receives signals corresponding to the error values and error locations and inserts the error values into the delayed input data stream at the correct time. The counter 116 is a modulo 16 counter which counts from 0 to 15 upon cycles of the input clock INCLK and then rolls over to continue this cycle. The output of the counter 116 from terminals Q0–Q3 form interleave addresses IAD0–IAD3 for use in this circuit and transmission to other parts of the circuitry. Particularly, these addresses produce the same interleaving partition that was necessary in the IRAMs of the first order and fourth order syndrome generators 102, 120 in FIGS. 7 and 8. Interleaved IRAMs 295, 294, 306 and 308 are similar to those IRAMs and act as shift registers with a 16 clock delay for data input to them.

The signal indicating the error location h−k is clocked into the IRAM 295 through its D0–D7 inputs when the SYNC* signal goes low. The occurrence of this signal, the output of an OR gate 293 labelled LERR, is by the end of a received data block or every 255 clock cycles. The signals indicating error solution calculated by the end of every received data block during the error processor cycle are thus clocked into the error correcting circuitry before a new error correction cycle begins. In a similar manner signals indicating the second error location h+k or error correction location j are clocked into the IRAM 294 simultaneously with the first. The same signal clocks the values of the error $e_{h-k}$ and $e_{h+k}$ or $e_j$ into IRAMs 306, 308, respectively. As the signals indicating the addresses circulate, the error locations (h+k), (h−k) are read out every sixteen clock cycles at the Q0–Q7 outputs of the memories 295, 294 to maintain synchronism with the phased bytes or terms of the respective received data block for which the solution was found.

The outputs of the IRAMs 288 and 294 are received by one set of inputs IA0–IA7 of XOR gates 296 and XOR gates 298, respectively. The signals indicating the output error locations h−k, h+k have previously been input to the IRAMs 295 and 294 and appear every sixteen clock cycles for 255 times after their entry. At the other inputs IB0-IB7 of the XOR gates 296, 298, the current address in the data stream from the modulo 255 counter 200 (FIG. 6) is input for comparison with the IA0-IA7 in both sets of gates. The XOR gates 296 compare the signal indicating the location $h-k$ at the correct times with the signal indicating the current address until an address match is made. When a match is present at the two inputs of an XOR gate, all outputs 01-08 will be zero. By wire ORing the outputs of the gate 296 together, a signal line 297 will provide an appropriate signal indicating that the current address matches the error location address $h-k$.

At that particular location and time, an AND gate 302 is enabled by the LERR signal from the gate 293 in order to read the signal indicating the error value $e_{h-k}$ from IRAM 306. In a similar manner, when the address from the output of IRAM the 294 matches the current address signal in the counter 200, the XOR gates 298 will output a signal via a line 299 enabling an AND gate 304. While the AND gate 304 is enabled, a clock signal LERR from the output of the gate 293 causes the error value for $e_{h+k}$ to be read from the IRAM 308.

During the preceding 4335 clock cycles the data in byte form have been stored in a delay line means 316 which comprises a random access memory of 4335 bytes (including other system delays). This amount of delay, 4335 clock cycles, is the total processing time for one interleaved data block. This delay provides time for data acquisition and syndrome generation and 255 clock cycles for error correction. The addresses in the RAM 316 are addressed by an address counter 318 which cycles by down counting from 4334 to 0 (less other system delays) and then repeating the cycle. The output of the delay means 316 is clocked into a latch 314 whose output is transmitted to the inputs IB0-IB7 of XOR gates 310 for comparison with the outputs of the IRAMs 306, 308. Data from the delay latch 314 are added to the delayed signals at the correct times in the XOR gates 310 to produce error correction and a corrected output via terminals O1-O8 which is clocked into a latch 312. The output Q0-Q7 of the latch 312 provides corrected data bytes synchronous with the output clock in the form of the originally encoded codeword $C(x)$.

The program stored in the control memory 222 is implemented with the assembly language code illustrated in the listing in FIGS. 17A and 17B beginning at the address 00 labeled START. The listing shows the assembly language or symbolic code which is stored in the control memory as the 16 bits per instruction word correspondingly indicated by the PROM listings 18G to 18J.

Figure 15:
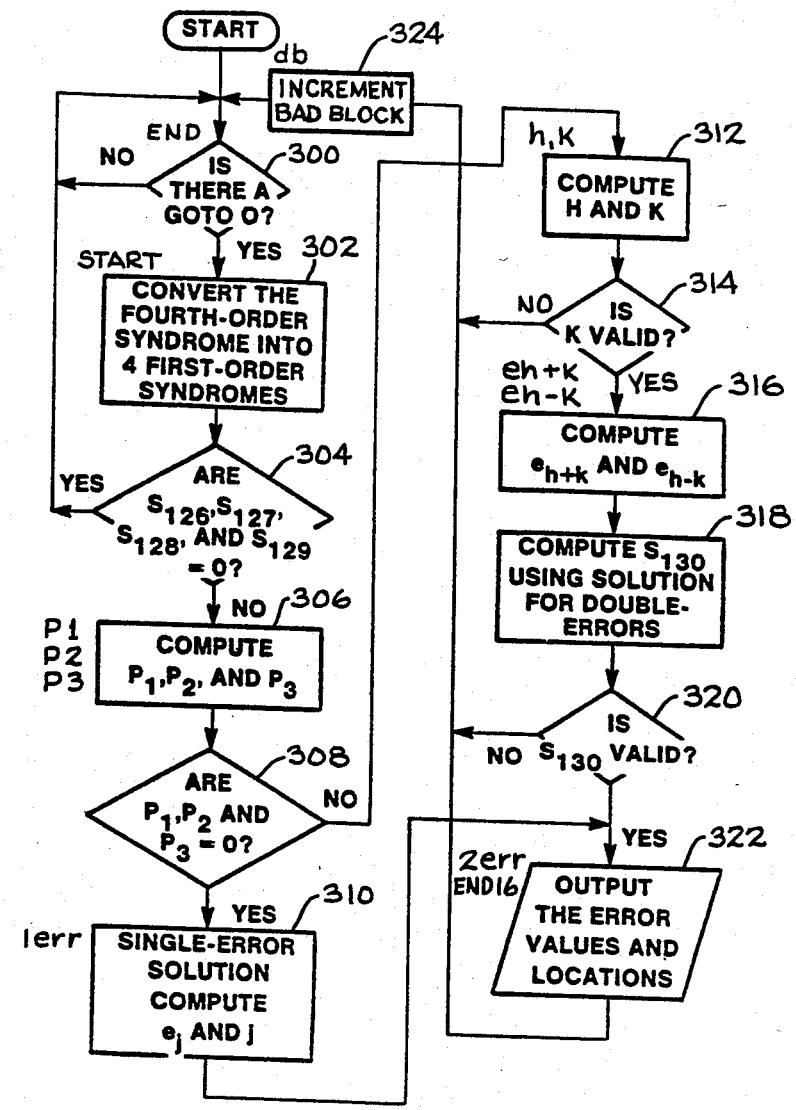
FIG. 15 is a flow chart for the operation of a program executed by the programmer-processor shown in FIG. 9.

The program idles at the address END by looping in a continuous manner between the last two instructions of the program until the program is reset. The program is reset or started by the conversion request signal CONREQ* which causes the program counter 238 to be reset to the address START. The conversion request occurs with every sync pulse indicating that the end of a code word has been sensed and an error correction cycle should take place. The program calculates from the equations for the two error solution the locations of the two errors of a preceding received data block $R(x)$ and the respective error values. A system flow chart for the program showing the function steps in these calculations is illustrated in FIG. 15. The flow chart will be referenced as the program in the listing of FIGS. 17A and 17B is discussed to associate the steps and to more clearly illustrate the implementation of the flow chart by the coding.

The first part of the program reads the coefficients for equation (71) which are $s_3$, $s_2$, $s_1$, and $s_0$ and from these factors calculates the four first order syndromes $S_{126}$, $S_{127}$, $S_{128}$, $S_{129}$ from the equations (72), (73), (74), and (75), respectively. Since the the factors $s_3$, $s_2$, $s_1$, and $s_0$ are available before the final byte of the respective received data block $R(x)$ is read into the syndrome generator, the program is initiated by the conversion request signal CONREQ* prior to this SYNC* signal to take advantage of this timing. Particularly, $s_3$ will be available 48 clock cycles prior to the sync signal and $s_2$, $s_1$, and $s_0$ will follow in evenly spaced 16 cycle intervals from the fourth order syndrome generator at sync-32, sync-16, and sync.

In the initial two steps of the program the coefficient $s_3$ is brought into the accumulator 72 and then stored in register R4 of registers 68. The register assignments for the variables used in this part and the rest of the program are shown in tables in FIGS. 16A and 16B. Thereafter, the accumulator is loaded with a $+1$ and incremented and successively summed with itself until a constant 126 is generated. This constant is stored in register R12 during the execution of the instruction at address START+12. The next two instructions read the coefficient $s_2$ into the accumulator and then store it in register R5 for later use by the program.

The constants 127, 128, and 129 are then calculated by successively adding $+1$ to the constant 126 in register R12 and storing the intermediate addends in registers R13, R14, and R15 respectively. At the next instruction, at address START+22, the accumulator is loaded again with the constant 126 and added to $\log_{\hat{a}} s_3$. This addition is the calculation of the intermediate factor $\log_{\hat{a}}(s_3 \hat{a}^{126})$. The following two instructions take the antilog of this term, and then add $s_2$ (in the Galois field) to generate the partial sum $s_3 \hat{a}^{126} + s_2$ which is thereafter temporarily stored in register R0. The term $s_1$ is then read into the accumulator from register R17 and stored in register R6. Continuing the calculation of $S_{126}$ the partial sum in R0 is next multiplied by $\hat{a}^{126}$ to yield the partial sum $s_3(\hat{a}^{126})^2 + S_2 \hat{a}^{126}$. $s_1$ is then aded to this sum by the instruction stored at the address START+ to yield the partial sum $s_3(\hat{a}^{126})^2 + s_2 \hat{a}^{126} + s_1$. This partial sum is restored in register R0 by the next instruction.

The subsequent four instructions calculate a partial sum $S_3 \hat{a}^{127} + s_2$ for the syndrome $S_{127}$ in the same manner the partial was calculated for the syndrome $S_{126}$, with the result being stored in register R1. At address START+36, the accumulator is loaded with the constant 127 (register R13) and then multiplied by the partial sum for $S_{127}$ by adding the log of register R1 to the accumulator in the next instruction. Thereafter $s_1$ is added to the partial sum to yield $s_3(\hat{a}^{127})^2 + s_2 \hat{a}^{127} + s_1$ which result is restored in register R1. In a similar manner the partial sum $s_3(\hat{a}^{128}) + s_2 \hat{a}^{128} + s_1$ is calculated by the instructions at addresses START+40-START+49. In addition, the program reads in the last coefficient $s_0$ from register $R_{17}$ at address START+44. $s_0$ is stored in register $R_7$ and the partial sum is stored in register R2.

The next four instructions (START+50-START+53) reload the constant 128 into the accumulator for a last multiplication of the partial sum in register R2 by $\hat{a}^{128}$ and then adds $s_0$ to the result. The entire syndrome $S_{128}$ has now been calculated and is stored in register R2 for use later in the program. There follows a block of four instructions which multiplies the partial sum in register R0 by $â^{126}$ and adds $s_0$ to the result. This calculation yields the final sum for the syndrome $S_{126}$ which is stored in register R0 for use later in the program. A similar set of steps is performed in the next four instructions to calculate a final syndrome $S_{127}$ from the partial sum in register R13. The result of the calculation is stored in register R1.

The program continues by calculating the partial sum $s_3(â^{129})^2 + s_2â^{129} + s_1$ for syndrome $S_{129}$ in the next eight instructions. The method of calculation is similar to that for the partial sums of the first three syndromes. One initially calculates $s_3â^{129}$ and then adds $s_2$, that partial sum is multiplied by $â^{129}$, and finally $s_1$ is added to the result. This result is stored in register R3 and the accumulator loaded with zero. In succession the next instructions load the zero from the accumulator into registers R18, R19, R10, and R4. Registers R18 and R19 are cleared at this point so that if no errors are found the error correcting circuitry will not add anything from these registers to the input data stream.

The four instructions (start+74–start+77) which continue the sequence, multiply the partial sum stored in register R3 by $â^{129}$ and add $s_0$ to the result. This is the final calculation for $S_{129}$ which is stored back into register R3 and further is reloaded in the accumulator. At this point in the program the fourth order syndrome has been converted to four first order syndromes $S_{126}$, $S_{127}$, $S_{128}$, and $S_{129}$. The values of these syndromes are stored in the registers indicated by the table in FIG. 16A for recall by the program. The functional step 302 in the flow chart of FIG. 15 is completed and the program continues.

$S_{129}$ is retained in the accumulator so that it can be ORed with the calculations for $S_{127}$ and $S_{128}$ in the next two instructions. This result is stored in register R5 and then recalled in a test instruction to determined if the result is zero. The result, if zero, indicates that at least three $S_{127}$, $S_{128}$, and $S_{129}$) of the four syndromes are zero and there are no errors in the preceding received data block R(x). The next instruction, BEQ end, because of the zero result will branch the program to the address END where it will loop until the next conversion request. Otherwise, if any one of the syndromes $S_{127}$, $S_{128}$, or $S_{129}$ is nonzero, the test is failed and the program continues to the group of instructions headed by address P1. This part of the program implements decisional block 304 of the flow chart in FIG. 15.

The partial term P1 is calculated by the following instructions from Equation (27) and the syndromes $S_{126}$, $S_{127}$, and $S_{128}$ stored in registers R0, R1, and R2 respectively. First the $\log_â S_{127}$ is added to the $\log_â S_{127}$ to yield the partial product $\log_â(S_{127})^2$. The antilog of this product is taken and the result stored in R8. Next the syndrome $S_{126}$ is placed in the accumulator and tested to determine if it is zero. If it is, the second term of Equation (27) will be zero and there is no reasons to go through the rest of the calculation as P1 has been determined. However, if $S_{126}$ is not zero, the program continues with the instruction at address P1+6 where $\log_â S_{126}$ is again loaded in the accumulator and then added to $\log_â S_{128}$ in the next step. The antilog of the partial term in the accumulator $\log_â(S_{126})(S_{128})$ is taken before adding the partial term in register R8 to produce a final calculation for P1. The result of the final calculation for P1 is stored in register R8.

The subsequent instructions at addresses P2–P2+8 perform a similar calculation for P2 from equation (31) by first forming the partial term $S_{128}^2$ and then forming the second term $S_{127} S_{129}$. The second term is first checked to determine if it is zero and is then calculated and added to the first term if the test is passed. P2, the sum of these two terms, is stored in register R9 for further use by the program.

The variable P3 is calculated from Equation (38) and the stored valves for $S_{126}$, $S_{127}$, $S_{128}$, and $S_{129}$ when the program continues after storing P2. Initially $S_{126}$ is loaded into the accumulator to test if it is zero. If it is, there is no reason to continue to calculate the first term of the Equation (38) as the product will be zero. Therefore, the BEQ #1 instruction will transfer control to the address #1 where the second term is calculated. If $S_{126}$ is not zero, the program continues in its normal sequence by multiplying $S_{126}$ by $S_{129}$ and storing the result in register R10.

The sequence has now reached address #1 either in a normal manner or by branching upon finding $S_{126}$ has a zero value. The syndrome $S_{127}$ is now loaded into the accumulator and tested to determine whether or not it has a zero value. If $S_{127}$ is zero, then P3 has been calculated and the program jumps to address #2 because of instruction BEQ #2. If, however, $S_{127}$ is nonzero, then the program continues normally where the term is first multiplied by $S_{128}$ and thereafter added to the result in register R10. This final calculation yields a value for P3 which is stored in register R10. The preceding group of instructions implements function step 306 in the flow chart in FIG. 15.

The value stored in register R10 (P3) is read and thereafter ORed with the values for P1 and P2 stored in registers R8 and R9 and the result tested for a zero value. This operation performs a check on the factors P1, P2, and P3 to determine if they are all zero. If it is determined that there are no nonzero factors, then only one error exists in the received data block R(x), and the program executes a branch instruction to a special handling routine for this case. The instruction BEQ Ierr executes the branch from the result of the test of the OR function stored in register R5 to address Ierr. However, if any one of the factors P1, P2, or P3 is nonzero, then there are at least two errors and the program continues by executing the sequence of instructions starting at address h.

The coding subsequent to the address labeled Ierr (Ierr-Ierr+12) is used to provide a simplified error solution when only one error is present. The single error solution is found from the values of the syndromes $S_{127}$, $S_{128}$ and the Equations (62) and (64). In the first instruction at address Ierr the $\log_â$ of the syndrome $S_{127}$ is negated by subtracting it from 255. The division for equation (62) is accomplished by adding $-\log_â S_{127}$ to $\log_â S_{128}$ in the next instruction. The result is the location j at which the single error occurs. Thereafter, the antilog of this number is taken to prepare the value for the output section of the routine and the result stored in register R6.

The ten instructions that occur after the determination of the single error location j are to determine the value of the error $e_j$ at that location. This set of instructions calculates this value from Equation (64) and the stored values of $S_{127}$ and $S_{128}$. The first two instructions form the product $S_{127}S_{128}$ by adding the logarithms of the contents of registers R1 and R2 together. A square root is taken of the product by raising the result of the addition to the 128th power via successive additions in the next seven steps. Finally, the error value $e_j$ is loaded into the output register R18 after the antilog of the successive summation is taken. These calculations implement the operation envisioned in block 310 of the system flow chart.

The next sequence of instructions at address h calculates the value for the midpoint h from Equation (37) and the values of P1 and P2 stored in registers R8 and R9, respectively. The $\log_{\hat{a}} P1$ is subtracted from 255 to determine the value of $\log_{\hat{a}} \overline{P1}$ and then added to $\log_{\hat{a}} P2$ to perform a division of P2 by P1. A square root of the result is obtained by raising the factor stored in the accumulator to the 128th power. The midpoint of the error locations, h, has been determined by this calculation since $$\log_{\hat{a}} \sqrt{\text{antilog }(\log_{\hat{a}} P2 - \log_{\hat{a}} P1)}$$

is equivalent to the right side of Equation (37). The result of the calculation is stored in register R11.

The solution for the value of the offset of the error locations, k, is performed by the sequence of instructions following the address labeled k. The calculation is the Galois field solution to Equation (44) from the stored values of P1, P2, and P3. As a first step, P1 is multiplied by P2 by adding the $\log_{\hat{a}}$ of these values. Next this product is negated by subtracting it from 255, yielding $-\log_{\hat{a}}(P2)(P1)$. The program thereafter takes the square root of the product yielding the denominator of Equation (44). The denominator is divided into the numerator P3 by subtracting it from $\log_{\hat{a}} P3$ and an antilog taken of the result in the following instruction. The result is the right side of Equation (44) which is equal to the left side $\hat{a}^k + \hat{a}HU - k$. To find k, the lookup table ARCHYP is used which stores all values of k corresponding to values of the function $\hat{a}^k + \hat{a}^{-k}$. The lookup table is accessed by the instruction acc=archyp (acc) which stores the value of k in the accumulator corresponding to the value of the archyp function previously located in the accumulator.

After the functional transformation has been completed, the results are placed in register R12. Before leaving the instruction, the accumulator has its antilog taken and that result is placed in register R15 to be used in the next calculation for $e_{h+k}$. At this place in the program, step 312 of the flow chart of FIG. 15 has been accomplished.

The value of k is then tested to determine if it is zero. A zero value for k returned from the function ARCHYP indicates that a valid solution of the function does not exist. Therefore, an affirmative response to the test by instruction BEQ bb will cause the program to branch to address bb where the fault condition is recorded. At address bb, the accumulator is loaded with zero from register R4. Next the zero in the accumulator is output to register address R23 to strobe that location, thereby setting the fault bit for this code word before jumping to end of the program. These instructions perform the step numbered 324 in the system flow chart.

Returning once again to instruction address $e_{h+k}+2$, if the program finds a valid solution for k then the sequence falls through the instruction BEQ bb and continues at the next address. In the next group of instructions (from address $e_{h+k}+2$-address $e_{h-k}$), the program calculates the value of the error $e_{h+k}$ from Equation (56). The first step of the process is to calculate $-k$ by subtracting the contents of register R12 from 255. Taking the antilog of the result ($\hat{a}^{-k}$) and adding it to the contents of register R15 ($\hat{a}^k$) yields the term $\hat{a}^k + \hat{a}^k$ which is stored in register R15 temporarily. Again $-k$ is calculated by subtracting the contents of register R12 from 255 and adding the result to the contents of register R11 to yield (h−k), with the result being stored in register R7 for the moment. In the next two instructions the $\log_{\hat{a}}$ of the syndrome $S_{127}$ is twice added to the factor h−k and the antilog taken yielding the term $\hat{a}^{h-k}(S_{127})^2$. This partial product of Equation (56) is then stored in register R13.

Following the calculation of the first factor of the numerator of equation (55), the second factor is calculated by first subtracting the contents of register R7 from 255 to yield the term $-(h-k)$. As was previously described for the first term, the $\log_{\hat{a}} S_{128}$ is twice added to $-(h-k)$ and the antilog taken. The result is the second term of the numerator $\hat{a}^{-(h-k)}(S_{126})^2$ which is then added to the first term prior to storing the entire sum in register R13.

In the next eight instructions, the square root of the numerator is found by raising the the contents of register R13 to the 128th power. The result of the root extraction is stored back into register R13. To set up the division of the numerator by the denominator the log of the contents of register R15 ($\hat{a}^k + \hat{a}^{-k}$) is negated by subtracting it from 255. The result is stored back into register R15 before being added to the contents of register R13 which completes the division by subtracting logarithms. The antilog of the result, which is the error value $e_{h+k}$, is stored in register R13 to await the error correction part of the routine.

The block of instructions (address $e_{h-k}$-address $e_{h-k}+20$) following the $e_{h+k}$ calculation performs a similar calculation for Equation (51) although with more simplicity because some of the terms of the equation have been previously calculated and are stored. In the first two instructions register R11 is added to register R12 to produce (h+k). The result is stored in register R6 and additionally left in the accumulator for further calculation. The log of the syndrome $S_{127}$ is then twice added to (h+k) and an antilog taken to provide the term $\hat{a}^{h+k}(S_{127})^2$. This first partial result is stored in register R14 before continuing. The subsequent steps of this block continue by calculating the second term of the numerator for Equation (51). The contents of register R6 (h+k) are negated and then the result has the $\log_{\hat{a}}$ of the syndrome $S_{128}$ twice added to it, yielding the term $\log_{\hat{a}} \hat{a}^{-(h-k)}(S_{128})^2$ from which an antilog is taken. This result is then added to the first term by Galois summing the accumulator with the contents of register R14. The resulting sum constituting the numerator of Equation (50) is then stored in register R14.

With the next eight instructions, the program calculates the square root of the numerator by raising it to the 128th power. The numerator is in logarithmic form and when added to the negative of the log of the denominator (previously stored in register R15) is divided thereby. The antilog of the result yields the value $e_{h-k}$ for the error at location h−k and is stored in register R14. Step 318 of the system flow chart has now been finished.

The validity of the solution for the error values can be checked by comparing the detected syndrome $S_{130}$ with the value calculated from Equation (57). In calculating the syndrome $S_{130}$ from equation (57) it is recognized that calculating $(â^{130(h+k)})^2$ is equal to calculating $â^{260(h+k)}$ or $â^{5(h+k)}$, which is easier than calculating $â^{130(h+k)}$. Therefore, a value for $(S_{130})^2$ is calculated by the next group of instructions in the program. The term $â^{5(h+k)}$ is provided by multiplying (h+k) in register R6 by itself twice and adding (h+k) to that product once. This result is multiplied by $(e_{h+k})^2$ by twice adding the $\log_{â}$ of the contents of register R13 to the accumulator. The antilog of the result $(e_{h+k})^2 â^{5(h+k)}$ is stored in register R15. The square of the second term of Equation (57) is calculated in a similar manner where the contents of register R7 (h−k) is successively added to itself to yield 5(h−k). The $\log_{â}$ of the contents of register R14 is then twice added to the result to yield $(e_{h-k})^2 â^{5(h-k)}$ from which an antilog is taken. This term is then added to the other partial result in register R15 such that $(S_{130})^2$ has been calculated as a function of the calculated error values and locations. The calculated value of $(S_{130})^2$ is subsequently stored in register R15. The preceding instructions implement block 318 of the flow chart.

The actual detected value of $S_{130}$ is then loaded into the accumulator and squared. The square of the actual value is left in the accumulator so that it can be exclusive ORed with the calculated value for $(S_{130})^2$. This result should be zero if the calculated value equals the actual value of the syndrome. The determination of the test of the exclusive OR function is obtained by loading the result of the operation into register R5 and testing that register for a zero value. If the contents of register R5 is zero, then the solution is valid and instruction BEQ 2err shifts control of the program to the address 2err where the values of the error and the locations of those errors are stored in the output registers. If the contents of register R5 are nonzero after the exclusive OR function, then the program falls through the branch instruction to address bb where the fault bit is set. These instructions complete the decisional block 320 of the flow chart.

Starting at address 2err, in the next two instructions the value for the error $e_{h+k}$ is moved from register R13 to the output register R18. Similarly, the following two instructions move the value for the error $e_{h-k}$ from register R14 to the output register R19. During the next two steps the antilog$_{â}$ of (h+k) is taken to ensure the location will be in the received data block R(x) when the error correction is made. The next instruction increments the correction counter by strobing register R22. Thereafter, two instructions take the antilog$_{â}$ of (h−k) for the same reason the other error location was converted to an antilog.

When these procedures have been completed, the program branches to the address labeled END 16 where the error locations are loaded into the output registers R16 and R17. Before loading these registers, the antilog of these values are taken and the addresses (h+k), (h−k), are multiplied by 16 (modulo 255) to translate the code word error locations into addresses used by the error correction circuitry. In addition the instruction acc=R22 again increments the correction counter to indicate that this code word has two errors. The program finishes as it started by looping at the address END while it waits for a conversion request. These instructions implement the block 322 in the system flow chart.

Figures 16A, 16B, 19:
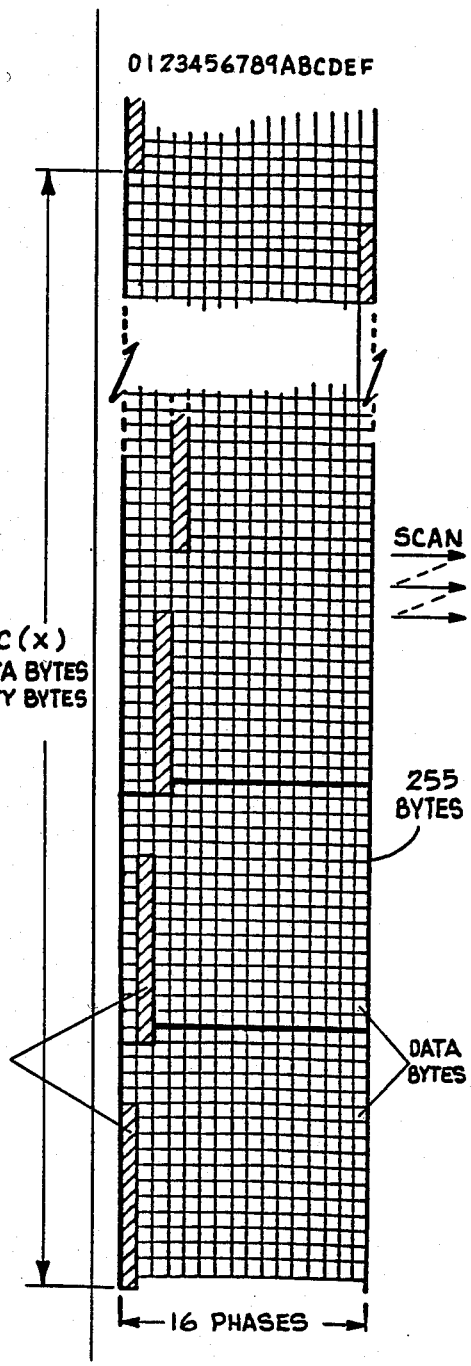
FIGS. 16A and 16B are tables identifying the usage of the internal input and output registers of the error processor shown in FIG. 3.
FIG. 19 is a diagrammatic illustration of an RS(255, 243) encoded data stream interleaved to a depth of 16.

The received data block comprises a data stream in byte format, with each element appearing synchronously to the input clock. The data stream has been previously encoded in Reed-Solomon (255, 243) code as shown in FIG. 19. The figure illustrates that each codeword C(x); is comprised of 243 data bytes and 12 parity bytes for an overall length of 255 bytes. The codewords $C(x)_i$ are also interleaved in time in sixteen phases O-F. Scanning occurs from the left of FIG. 19 across one line to the right, down one line, and then repeats. Therefore, from the beginning of one codeword to the beginning of the next codeword of the same phase 255×16 clock cycles are needed. Additionally, each codeword end is offset in the phasing from other codeword ends such that they are separated by 255 clock cycles.

Figure 20:
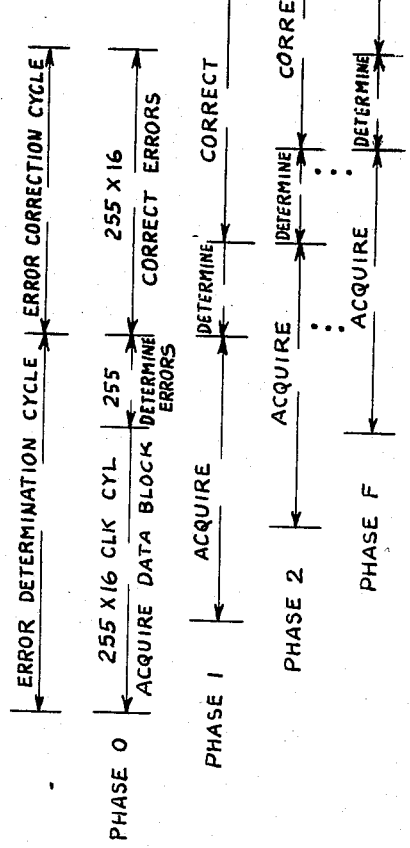
FIG. 20 is a graphic depiction of the relative cycles of receiving data, determining errors and correcting errors as performed by the decoder shown in FIG. 2.

The decoder uses the phasing and separation of the received data blocks R(x) to advantage to provide an error correction scheme which can be accomplished in real time. As shown in FIG. 20, the decoder delays the incoming data for the duration of an error determination cycle which is defined as the amount of time in clock cycles that is required to obtain a full data block (255×16) plus 255. The error solution must be accomplished before another end of block signal, or data will have to be stored. The error processor thus uses the 255 clock cycle time between the successive ends of interleaved data blocks to do the error calculation. That error solution is output on the next SYNC pulse and is used in an error correction cycle (255×16 clock cycles) to combine the error solutions with the delayed data block at the correct locations. This timing scheme inserts a one time delay of the error determination cycle into the data stream but otherwise accomplishes the error corrections in real time.

If the calculation of the error values and their locations required more time than this, then the process could not be done in real time. The distinct advantage of having a decoder which will detect and correct errors in every received data block will therefore be forfeited.

Figure 21:
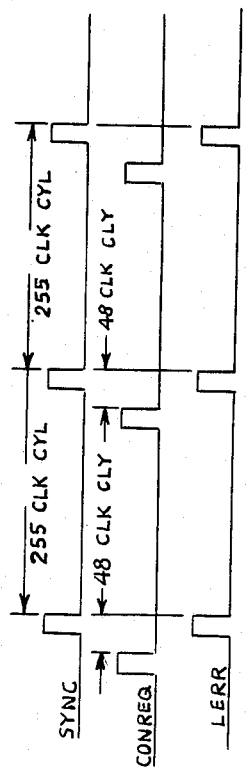
FIG. 21 shows waveforms indicating the relative timing of certain timing signals generated in the decoder shown in FIG. 2.

FIG. 21 illustrates the actual timing for the 255 clock cycles in which the error values and their locations are calculated. Every SYNC pulse ends a received data block and is 255 clock cycles from the next SYNC pulse. The timing and control circuitry generates the conversion request signal CONREQ 48 clock cycles prior to the SYNC pulse to begin the program operation steps, and the error calculations are finished prior to the next request 48 clock cycles before the subsequent SYNC pulse. The load error value pulse LERR is synchronous with the subsequent SYNC pulse and loads the error solutions and locations into the IRAMs of the error correction circuitry at the beginning of an error correction cycle for the previous received data block.

Although a specific preferred embodiment has been described, various modifications may be made therein within the scope of this invention. For example, other Reed-Solomon codes may be used, including cosets properly managed. The particular code generator polynomial used in the embodiment described is:

$$g(x) = â^0 x^{12} + â^{78} x^{11} + â^{70} x^{10} + â^{103} x^9 + â^{36} x^8 + \qquad (76)$$
$$â^{102} x^7 + â^{232} x^6 + â^{102} x^5 + â^{36} x^4 + â^{163} x^3 + â^{70} x^2 + â^{78} x^1 + â^0$$

However, other code generator polynomials and polynomials of different orders may be used as well as other Galois fields and other primitives. The depth of interleaving may be changed. With the interleaving, it is within the scope of this invention to provide a plurality of error processors operating in parallel on received data blocks of respective phases. By corresponding increasing the length of the data delay, more time may thus be provided for real time correction, as might be needed, for example, for shorter RS codes. Shorter RS codewords would have the advantage of fewer errors per data block, permitting correction of a greater proportion of the errors.

It is possible to utilize as few as four parity bytes and still correct two errors. However, this would lose the ability of identifying a greater number of errors (as by use of the fifth syndrome) and could result in the changing of terms that were not in error, hence adding and not reducing errors. This would nevertheless be practical in many systems where there were relatively few occasions of more than two errors per data block.

It should also be understood that conventional means may be utilized to provide any needed delays in the various control pulses as may be necessary for timing. The data delays are such as to keep the various signals in proper synchronization.

What is claimed is:

1. An error detection and correction system for locating and correcting double errors in a received data block word digitally encoded in a Reed-Solomon code (n,K) as coefficient terms of an n-order codeword polynomial in the form $$C(x) = \sum_{i=0}^{n-1} c_i x_i$$

where i is an integer and the coefficients are powers of the primitive â of a Galois field, which codeword is divisible by a code generator polynomial in the form of a product of a plurality of different factors in the form $(x+â^i)$, where $â^i$ is a power of said primitive â, said system comprising:

syndrome generation means responsive to signals representing a received data block word for deriving four syndrome signals each corresponding to a respective first order syndrome equal to the remainder upon dividing in said Galois field said received data block word by a respective said factor;

error locator means for locating the terms in said received data block word containing respective said errors, said error locator means comprising means operating in said Galois field and responsive to said four syndrome signals for deriving a reference signal corresponding to the position of a reference term in said received data block word equally spaced relative to said terms containing said errors, means operating in said Galois field and responsive to said four syndrome signals for deriving a relative position signal corresponding to the number of terms by which the terms containing said errors are spaced from said reference term, and means for combining said reference signal and said relative position signal to form combined error location signals corresponding to the positions of the terms containing the respective errors;

error solution means responsive to said four syndrome signals for producing first and second error solution signals corresponding to the differences between the respective received terms containing said errors and the corresponding terms as encoded; and error correction means responsive to said error location signals and said error solution signals for correcting said signals representing a received data block word.

2. An error detection and correction system according to claim 1 wherein said syndrome generator means includes means for deriving a fifth syndrome signal corresponding to a respective first order syndrome equal to the remainder upon dividing in said Galois field said received data block word by a fifth different respective said factor, and wherein said system includes means responsive to said fifth syndrome and to the outputs of said error locator means and said error solution means for producing an inhibiting signal when a received data block signal contains more than two errors, and means responsive to said inhibiting signal for inhibiting operation of said error correction means when there are more than two errors in a received data block signal.

3. An error detection and correction system according to claim 2 further comprising means responsive to said syndrome signals for providing a single error indicating signal when said received data block signal contains but a single error, said error locator means including means responsive to said single error indicating signal and two of said syndrome signals for providing an error locator signal corresponding to the position of the term containing said single error, and said error solution means including means responsive to said single error indicating signal and two said syndrome signals for providing an error solution signal corresponding to the difference between the received term containing said single error and the corresponding term as encoded.

4. An error detection and correction system according to claim 1 further comprising means responsive to said syndrome signals for providing a single error indicating signal when said received data block signal contains but a single error, said error locator means including means responsive to said single error indicating signal and two of said syndrome signals for providing an error locator signal corresponding to the position of the term containing said single error, and said error solution means including means responsive to said single error indicating signal and two said syndrome signals for providing an error solution signal corresponding to the difference between the received term containing said single error and the corresponding term as encoded.

5. An error detection and correction system according to any one of claims 1 to 4 wherein said means for deriving a reference signal operates in said Galois field to derive a signal corresponding to the term $â^h$, where h corresponds to said reference term, and includes means for evaluating h to form said reference signal, and wherein said means for deriving a relative position signal derives a signal corresponding to the term $(â^k+â^{-k})$, where k corresponds to the number of terms by which the terms containing said errors are spaced from said reference term, and includes means for evaluating k to form said relative position signal.

6. A method for locating and correcting double errors in a received data block word digitally encoded in a Reed-Solomon code (n,K) as coefficient terms of an n-order codeword polynomial in the form $$C(x) = \sum_{i=0}^{n-1} c_i x_i$$

where i is an integer and the coefficients are powers of the primitive â of a Galois field, which codeword is divisible by a code generator polynomial in the form of a product of a plurality of different factors in the form $(x+â^i)$, where $â^i$ is a power of said primitive â, said method comprising:

responsive to signals representing a received data block word, deriving four syndrome signals each corresponding to a respective first order syndrome equal to the remainder upon dividing in said Galois field said received data block word by a respective said factor;

locating the terms in said received data block word containing respective said errors by operating in said Galois field in response to said four syndrome signals to derive a reference signal corresponding to the position of a reference term in said received data block word equally spaced relative to said terms containing said errors, operating in said Galois field in response to said four syndrome signals to derive a relative position signal corresponding to the number of terms by which the terms containing said errors are spaced from said reference term, and combining said reference signal and said relative position signal to form combined error location signals corresponding to the positions of the terms containing the respective errors;

responsive to said four syndrome signals, producing first and second error solution signals corresponding to the differences between the respective received terms containing said errors and the corresponding terms as encoded; and responsive to said error location signals and said error solution signals, correcting said signals representing a received data block word.

7. A method according to claim 6 further comprising deriving a fifth syndrome signal corresponding to a respective first order syndrome equal to the remainder upon dividing in said Galois field said received data block word by a fifth different respective said factor, and responsive to said fifth syndrome and to the outputs of said error locator means and said error solution means, producing an inhibiting signal when a received data block signal contains more than two errors, and responsive to said inhibiting signal inhibiting said error correction when there are more than two errors in a received data block signal.

8. A method according to claim 7 further comprising in response to said syndrome signals providing a single error indicating signal when said received data block signal contains but a single error, in response to said single error indicating signal and two of said syndrome signals providing an error locator signal corresponding to the position of the term containing said single error, and responsive to said single error indicating signal and two said syndrome signals providing an error solution signal corresponding to the difference between the received term containing said single error and the corresponding term as encoded.

9. A method according to claim 6 further comprising in response to said syndrome signals providing a single error indicating signal when said received data block signal contains but a single error, in response to said single error indicating signal and two of said syndrome signals providing an error locator signal corresponding to the position of the term containing said single error, and responsive to said single error indicating signal and two said syndrome signals providing an error solution signal corresponding to the difference between the received term containing said single error and the corresponding term as encoded.

10. A method according to any one of claims 6 to 9 wherein deriving said reference signal includes operating in said Galois field to derive a signal corresponding to the term $â^h$, where h corresponds to said reference term, and evaluating h to form said reference signal, and wherein deriving said relative position signal includes deriving a signal corresponding to the term $(â^k+â^{-k})$, where k corresponds to the number of terms by which the terms containing said errors are spaced from said reference term, and evaluating k to form said relative position signal.

11. A decoder for error correcting a received digital data block $R(x)$ encoded as a codeword $C(x)$ having a plurality of data bytes and a plurality of check bytes, said codeword being encoded in a Reed-Solomon code such that division of the received data block by the generator polynomial will produce a plurality of syndromes $S_i$ which contain information about the errors contained in the received code words, said decoder comprising:

means for generating a plurality of syndromes from a received code word, input register means for storing the generated syndromes when they become available from said syndrome generator, an arithmetic/logic unit (ALU) for performing arithmetic or logical operations on one or two operands input to a first channel or to a second channel of said unit in accordance with a control word and for outputting the results of the operation to an accumulator, output register means for storing the locations of the errors and the values of the errors in said received data block $R(x)$, internal register means for the temporary storage of the output of said accumulator, a first data path connecting the output of said input register means and the output of said internal register means to one of said first and second channels of said ALU, a second data path connecting the output of said accumulator to the input of said output register means, the input of said internal register means, and the other of said first and second channels of said ALU, and processor means for controlling the transfer of data over said first and second data paths and for generating a control word which selects an operation for the (ALU).

12. A decoder as set forth in claim 11 wherein:

said first data path has disposed between its input and output a plurality of translational means adapted to transform data transmitted along said select path into a corresponding value of a predetermined function of the data.

13. A decoder as set forth in claim 12 wherein one of said translational means comprises:

a buffer which transmits received data unmodified.

14. A decoder as set forth in claim 12 wherein one of said translational means comprises:

means for translating a received data value into the logarithm of that value.

15. A decoder as set forth in claim 12 wherein said processor means includes:

means for enabling one of said translational means while disabling the rest during a data transfer over said first path, said enablement providing for the selection of the type of translations for the data value desired at the destination of the transfer.

16. A decoder as set forth in claim 11 wherein:
said second data path has disposed between its input and output a plurality of translational means adapted to transform data transmitted along said second path into a corresponding value of a predetermined function of the data.

17. A decoder as set forth in claim 16 wherein one of said translational means comprises:
first means which transmits received data unmodified.

18. A decoder as set forth in claim 16 wherein one of said translational means comprises:
second means for translating a received data value into an antilogarithm of that value.

19. A decoder as set forth in claim 16 wherein one of said translational means comprises:
third means for translating a received data value R into a value for k according to the function:

$$â^k + â^{-k} = R$$

where â is the primitive of a Galois field.

20. A decoder as set forth in claim 16 wherein said processor means includes:
means for enabling one of said translational means while disabling the rest during a data transfer over said second path, said enablement providing for the selection of the type of translation for the data value desired at the destination of the transfer.

* * * * *

UNITED STATES PATENT AND TRADEMARK OFFICE
CERTIFICATE OF CORRECTION

PATENT NO. : 4,597,083

DATED : June 24, 1986

INVENTOR(S) : Roger M. Stenerson

It is certified that error appears in the above-identified patent and that said Letters Patent is hereby corrected as shown below:

Column 38, line 19, "of the received" should read --by the received--;

Column 5, equation 10, "$c_{253},^{253}$ ..." should read --$c_{253}x^{253}$ ...--;

Column 5, equation 12, "$g(x)=(x+a^f)(x+a^{f+1})...(x+a^{f+11})$" should read --$g(x)=(x+\hat{a}^f)(x+\hat{a}^{f+1})...(x+\hat{a}^{f+11})$--;

Column 6, equation 13:

"$S_i = \text{Remainder}\ [R(x)/(x + a^i)] = \sum_{j=0}^{n-1} r_j a^{ij}$" should read --$S_i = \text{Remainder}\ [R(x)/(x + \hat{a}^i)] = \sum_{j=0}^{n-1} r_j \hat{a}^{ij}$--;

Column 6, equation 14:

"$S_i = \text{Remainder}\ [E(x)/(x + a^i)] = \sum_{j=0}^{n-1} e_j a^{ij}$" should read --$S_i = \text{Remainder}\ [E(x)/(x + \hat{a}^i)] = \sum_{j=0}^{n-1} e_j \hat{a}^{ij}$--;

Column 6, line 68, "the the" should read --the--;

UNITED STATES PATENT AND TRADEMARK OFFICE
CERTIFICATE OF CORRECTION

| | | |
|---|---|---|
| PATENT NO. : | 4,597,083 | Page 2 of 3 |
| DATED : | June 24, 1986 | |
| INVENTOR(S) : | Roger M. Stenerson | |

It is certified that error appears in the above-identified patent and that said Letters Patent is hereby corrected as shown below:

Column 7, equations 18 through 22, $\hat{a}$ following $r_j$ should be superscript (it is shown on main line);

Column 7, line 47, "arithretic" should read --arithmetic--

Column 8, equation 37, "$\log_a$" should read --$\log_{\hat{a}}$--

Column 19, line 2, "programmer-processor" should read --programmed processor--;

Column 19, line 15, "programmer-processor" should read --programmed processor--;

Column 19, line 22, "programmer processor" should read --programmed processor--;

Column 19, line 65, "takes places" should read --takes place--;

Column 27, line 19, "IRAM the 294" should read --IRAM 294--;

Column 28, line 46, "START+ to" should read --START+30 to--;

Column 29, line 39, "to determined if" should read --to determine if--;

Column 29, line 41, "three $S_{127}$," should read --three ($S_{127}$,-

Column 29, line 59, is no reasons" should read --is no reason--;

UNITED STATES PATENT AND TRADEMARK OFFICE
CERTIFICATE OF CORRECTION

PATENT NO. : 4,597,083

DATED : June 24, 1986

INVENTOR(S) : Roger M. Stenerson

It is certified that error appears in the above-identified patent and that said Letters Patent is hereby corrected as shown below:

Column 30, line 49, "+12" should read --+2--;
Column 31, line 37, "+âHU -k" should read --+$\hat{a}^{-k}$--;
Column 32, line 4, "+$\hat{a}^k$" should read --+$\hat{a}^{-k}$--;
Column 32, line 24, "the the" should read --the--;
Column 33, line 42, "Similarily" should read --Similarly--;
Column 34, line 21, "end of block" should read --end of code word signal--;
Column 35, line 1, "corresponding" should read --correspondingly--.

Signed and Sealed this

Eighteenth Day of August, 1987

*Attest:*

DONALD J. QUIGG

*Attesting Officer*   *Commissioner of Patents and Trademarks*